United States Patent [19]
Shiraishi

[11] Patent Number: 6,108,089
[45] Date of Patent: Aug. 22, 2000

[54] POSITION DETECTING APPARATUS AND METHOD FOR PROJECTION EXPOSURE APPARATUS

[75] Inventor: Naomasa Shiraishi, Saitama-ken, Japan

[73] Assignee: Nikon Corporation, Tokyo, Japan

[21] Appl. No.: 09/241,630

[22] Filed: Feb. 2, 1999

Related U.S. Application Data

[63] Continuation of application No. 08/745,627, Nov. 8, 1996.

[30] Foreign Application Priority Data

Oct. 11, 1995 [JP] Japan ...................................... 7-292313
Jul. 23, 1996 [JP] Japan ...................................... 8-193049

[51] Int. Cl.$^7$ ........................................................ G01B 11/14
[52] U.S. Cl. ................................................................ 356/375
[58] Field of Search ..................................... 356/399–401, 356/375, 376; 250/548, 559.3; 355/43, 53; 438/16

[56] References Cited

U.S. PATENT DOCUMENTS 4,962,318 10/1990 Nishi .
5,140,366  8/1992 Shiozawa et al. .
5,253,040 10/1993 Kamon et al. .
5,493,403  2/1996 Nishi .

*Primary Examiner*—K. P. Hantis
*Attorney, Agent, or Firm*—Armstrong, Westerman, Hattori, McLeland & Naughton

[57] ABSTRACT

By scanning a wafer mark to be detected in a measurement direction with respect to a sheet-shaped laser beam and by photoelectrically converting diffraction light generated from the wafer mark, a mark detection signal f(X) is obtained as a function of an X-coordinate value of the wafer mark. On the basis of an emphasized signal g(X) obtained by effecting convolution calculation of a numerical filter with respect to the mark detection signal f(X), slice level Sl, Sr for both edge portions of the mark detection signal are determined, an average value of X-coordinate values of intersections between the slice levels Sl, Sr and the mark detection signal f(X) or the emphasized signal g(X) is used as a detection position of the wafer mark. Alternatively, by scanning a wafer mark to be detected in a measurement direction with respect to a sheet-shaped laser beam and by photoelectrically converting diffraction light generated from the wafer mark, a mark detection signal f(X) is obtained as a function of an X-coordinate value of the wafer mark. Reference signals g(X) in which the change portions (edges) of the mark detection signals obtained from other wafer marks are previously determined, and correlation function h(X) between the reference signals g(X) and the mark detection signal f(X), and an X-coordinate value X1 when the relative function h(X) becomes maximum is used as the position of the wafer mark.

25 Claims, 14 Drawing Sheets

Fig. 2A
Fig. 2B
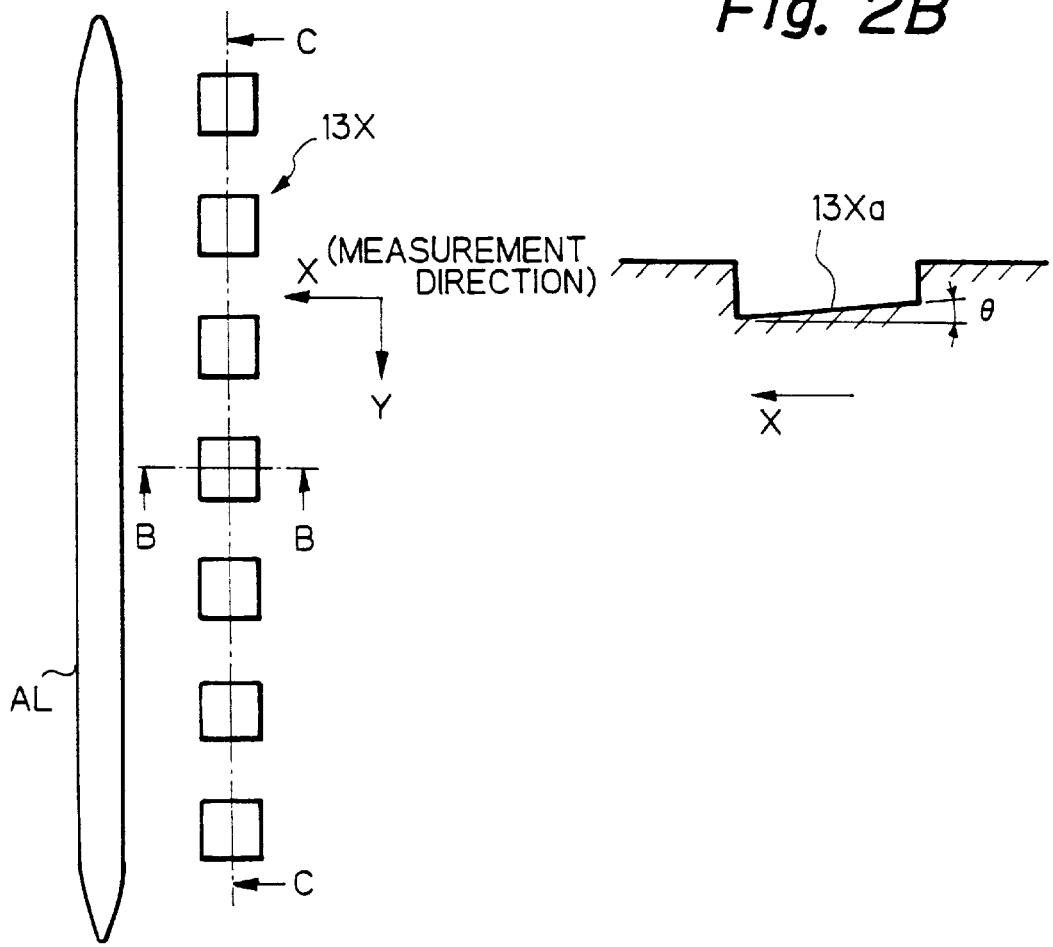
Fig. 2C
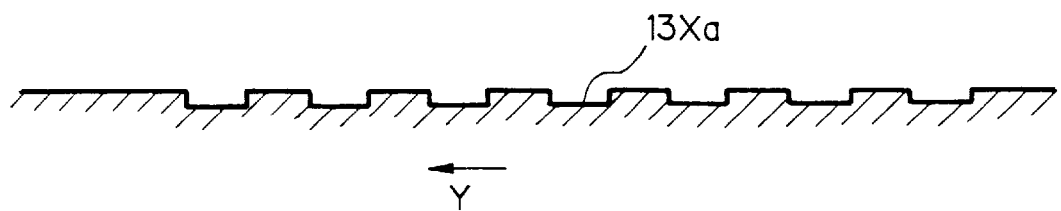

POSITION DETECTING APPARATUS AND METHOD FOR PROJECTION EXPOSURE APPARATUS

This application is a Continuation application of prior application Ser. No. 08/745,627 filed Nov. 8, 1996.

BACKGROUND OF THE INVENTION

1. Field of the Invention

The present invention relates to a position detecting apparatus and method used with a projection exposure apparatus and adapted to detect position detection marks formed on a surface of a substrate such as a semiconductor wafer, and more particularly, to a position detecting apparatus suitable for using as an alignment sensor provided in an exposure apparatus for exposing a photosensitive substrate through a mask pattern (or for transferring a mask pattern onto a photosensitive substrate) in a photolithography process in manufacturing semiconductor elements, image elements (such as CCDs), liquid crystal display elements or thin film magnetic heads, for example, and adapted to detect position detection marks on the photosensitive substrate.

2. Description of the Related Art

For example, in a photolithography process for manufacturing semiconductor elements and the like (for example, a process for forming a resist image of a mask pattern on a substrate), a projection exposure apparatus (such as a stepper) for transferring a pattern formed on a reticle as a mask onto a wafer (or a glass plate and the like) on which photoresist is coated, via a projection optical system, or, another exposure apparatus (such as an exposure apparatus of proximity type) for directly transferring a reticle pattern onto a wafer has been used.

For example, since the semiconductor wafer is formed by laminating multilayer circuit patterns on the wafer in a predetermined positional relation, when two or more circuit patterns are formed on the wafer by using such an exposure apparatus, alignment between the reticle and the circuit pattern on each of shot areas of the wafer must be performed with high accuracy prior to the exposure operation. To perform such alignment, alignment marks (wafer marks) as position detection marks have already been formed on the wafer in the previous processes, and, by detecting the positions of the alignment marks by means of an alignment sensor mounted on the exposure apparatus, the accurate or correct positions of the circuit patterns in the shot areas on the wafer can be detected.

In the conventional alignment sensors, for example, it is known to use a system (referred to as "laser beam scan system" hereinafter) in which a spot-shaped or a sheet-shaped laser beam and an alignment mark are scanned relative to each other in a measurement direction to detect generated scattering light and/or diffraction light which is generated from the alignment mark, and the mark position is determined on the basis of the change in intensity of the light, or a system (referred to as "image forming position detecting system" hereinafter) in which a broadband luminous flux from a light source such as a halogen lamp is illuminated on a predetermined area including the alignment mark to obtain an image of the mark through an image forming optical system, and the position of the mark is determined on the basis of an image signal from the system. The laser beam scan system is also called a "laser-step-alignment" system LAS system and the image forming position detecting system is also called an "FIA" Field Image Alignment system.

In signal treatment methods for accurately determining or detecting the position of the alignment mark on the basis of the mark detection signal obtained based on the alignment sensor, there is a method wherein the mark detection signal curve is sliced at a predetermined intensity level and coordinates of an intersection between the signal curve and the intensity level are utilized as the mark positions, and another method wherein a relation between the mark detection signal curve and a predetermined reference signal is calculated so that a position where the relation becomes a maximum is utilized as the mark position.

Among the above-mentioned conventional alignment sensors, in the laser beam scan system, since the used detection luminous flux is a monochromatic laser beam, there may arise multi-interference between the surface of the wafer and a surface of the photoresist coated on the wafer, thereby causing a significant error in the detected mark position. To avoid this, detection luminous flux having a plurality of wavelengths (composite luminous flux obtained by combining a plurality of laser beams having different wavelengths) is used to reduce an influence of the multi-interference caused by the monochromatic feature. On the other hand, in the image forming position detecting system, since a broad-band luminous flux is used as the illumination luminous flux, no multi-interference is generated.

Recently, as semiconductor integrated circuits have become miniaturized, a process for flattening the surface of the wafer has been introduced after a film forming process and prior to the photolithography process. This flattening process provides an advantage in that an element feature can be improved by making a thickness of the film on which the circuit pattern is formed uniform and an advantage that a negative influence of an unevenness of the surface of the wafer which causes a line-width error of a transferred pattern can be reduced.

However, in systems in which the position of the alignment mark is detected on the basis of the change in the unevenness and/or the change in reflectance factor at the alignment mark portion of the wafer surface, since the degree of the unevenness of the alignment mark portion is greatly decreased by the flattening process, there arises an inconvenience that it is difficult to detect the alignment mark. Particularly, in a process regarding opaque formed films (such as metal films and semiconductor films), since the alignment mark is coated or covered by the opaque film having uniform reflectance factor, the positional detection merely depends upon the degree of the unevenness of the surface of the film, which slightly changes in accordance with the unevenness of the alignment mark, thereby causing positional detection to be more difficult it performs. That is to say, if the opaque formed film is flattened, the detection of the position of the alignment mark would become more difficult.

Since an amount of level difference of the unevenness (height difference between top and bottom levels of the unevenness) of the surface of the opaque formed film is much less than a coherent length of light defined by a wavelength and a width of the wavelength of the detection luminous flux, interference between light reflected from the top of the unevenness (level difference portion) and light reflected from the bottom of the unevenness causes a problem (although such interference does not cause any problem so long as the broad-band light is used regarding the marks having a conventional amount of the level difference). For example, if the bottom of the unevenness of the uneven mark is asymmetrical due to an inclination or the like, since interference conditions of the reflection differ from each other, at mark edges on both sides of the bottom, in between the light reflected from the top of the unevenness and the light reflected from the bottom of the unevenness, a detected signal waveform would also become asymmetric, thereby causing an error in the position detection result.

SUMMARY OF THE INVENTION

An object of the present invention is to provide a position detecting apparatus in which, even if an amount of level difference of an unevenness of a position detection mark is very small or even if the level difference of the unevenness of the position detection mark is asymmetrical at the mark edges, a position of the position detection mark can easily be detected with high accuracy by using an emphasis signal for emphasizing the change in a position detection signal corresponding to intensity of light reflected from the position detection mark on a substrate.

Another object of the present invention is to provide a position detecting apparatus in which the emphasis signal for emphasizing the change in the position detection signal corresponding to the position detection mark is previously stored in an emphasized reference signal storing means as an emphasized reference signal, a correlation function is obtained from a relationship between the position detection signal and the emphasized reference signal read out from the emphasized reference signal storing means, and the position of the position detection mark is determined on the basis of the correlation function, whereby the position of the position detection mark can be obtained with higher accuracy.

A position detecting apparatus according to a first embodiment of the present invention comprises a detection optical system (11; 11A) for illuminating illumination light onto a position detection mark (13X; 15X) on a substrate (W) to be treated and for receiving light returned or reflected from the position detection mark and for outputting a detection signal (DS; DSA) corresponding to intensity of the returned light, a signal treatment means (31; 62) for detecting a position of the position detection mark on the basis of the detection signal outputted from the detection optical system, and a signal emphasizing means (30; 61) for emphasizing the change portion in the detection signal outputted from the detection optical system, the signal treatment means (31; 62) detecting the position of the position detection mark by using a signal in which the change portion is emphasized by the signal emphasizing means.

According to such a position detecting apparatus, the "change portion" in the detection signal (position detection signal) from the detection optical system is emphasized by the signal emphasizing means (30; 61). By performing the positional detection on the basis of the signal in which the change portion is emphasized, any position detection marks having a very small amount of level difference (for example, smaller than the coherent length of the detection luminous flux) or any position detection marks having small amount of level difference and being asymmetrical in a measurement direction can be detected with higher accuracy than those of the conventional position detecting apparatuses.

In this case, according to one aspect of the present invention, the signal treatment means (31; 62) serves to determine a slice level on the basis of the signal in which the change portion is emphasized by the signal emphasizing means and to slice the detection signal (mark detection signal) curve outputted from the detection optical system (11; 11A) at the determined slice level, thereby detecting the position of the position detection mark. That is to say, the signal in which the change portion was emphasized by the signal emphasizing means is merely used to determine the slice level.

According to another aspect of the present invention, the signal treatment means (31; 62) serves to determine a slice level on the basis of the signal, the change portion of which is emphasized by the signal emphasizing means, and to slice, at the determined slice level, the signal, the change portion of which is emphasized by the signal emphasizing means (30; 61), thereby detecting the position of the position detection mark. That is to say, the signal, the change portion of which is emphasized by the signal emphasizing means, is used to determine the slice level and is simultaneously subjected to the slicing.

According to one aspect of the present invention, the signal emphasizing means (30) serves to perform a treatment (convolution calculation) in which a signal corresponding to a predetermined first position (X0) among the detection signals outputted from the detection optical system is multiplied by A (A is a positive real number), signals, among the detection signals, corresponding to second and third positions (Xm, Xp) spaced apart from the first position by predetermined distances in both forward and backward directions along a measurement direction are multiplied by B (B is a negative real number), and the signal multiplied by A is added to the two signals multiplied by B. By adjusting the values A and B, the degree of emphasis of the detection signal can easily be adjusted. In this case, it is desirable that the values A and B satisfy the following equation (1):

$$A+2B=1 \tag{1}$$

By satisfying the above equation, only the change component of the detection signal can be emphasized without changing the average level of the detection signal, thereby facilitating any signal post-treatment processing.

According to another aspect of the present invention, the signal emphasizing means serves to perform a treatment in which the intensity of a signal corresponding to a component greater than a predetermined frequency component of the detection signal is emphasized. By doing so, only the component which is changed at a frequency greater than the predetermined frequency can be emphasized.

According to one aspect of the present invention, the detection optical system (11) is an optical system (for example, an optical system of laser beam scan type) in which the illumination light is illuminated on the substrate (W) in such a manner that the illumination light is collected in the vicinity of the position detection mark (13X), and, when the position detection mark (13X) and the illumination light are scanned relative to each other, the light returned or reflected from the position detection mark is detected.

According to another aspect of the present invention, the detection optical system (11A) is an optical system (for example, an optical system of image forming position detecting type) including an image forming optical system (48, 50, 53) for forming an image of the position detection mark (15X) on the substrate (W) and wherein an imaging signal (DSA) corresponding to the image of the position detection mark (15X) is outputted as the detection signal.

According to one aspect of the present invention, the image forming optical system (48, 50, 53) may be provided with a phase contrast filter (74) disposed in the vicinity of a Fourier transform plane regarding the position detection mark (15X) so that the detection optical system corresponds to an optical system of phase contrast microscope type.

According to a further aspect of the present invention, the position detecting apparatus includes the detection optical system (11; 11A) for illuminating the illumination light onto the position detection mark (13X) on the substrate (W) to be treated and for receiving the light returned or reflected from the position detection mark and for outputting the detection signal (DS; DSA) corresponding to the intensity of the returned light, whereby the position of the position detection mark (13X) is detected on the basis of the detection signal outputted from the detection optical system, and further includes a memory means (31; 62) for storing a predetermined emphasized reference signal in which the change portion thereof is more emphasized than that of the detection signal (DS; DSA), and a signal treatment means (30; 61) for calculating a correlation function obtained from a correlation between the detection signal (DS; DSA) and the emphasized reference signal read out from the memory means while laterally shifting the detection signal and the emphasized reference signal correlative to each other and for seeking an amount of a relative lateral shift between these two signals when the relative function becomes a predetermined value, and wherein the position of the position detection mark (13X) is determined on the basis of an amount of the relative lateral shift sought by the signal treatment means.

According to this aspect, since the correlative function between the predetermined emphasized reference signal (in which the change portion thereof is emphasized) read out from the memory means (31; 62) and the detection signal (DS; DSA) while laterally shifting the detection signal and the emphasized reference signal relative to each other, regarding the detection signal from the position detection mark having a very small amount of level difference (for example, smaller than the coherent length of the detection luminous flux) or the position detection mark having a small amount of level difference and being asymmetrical in the measurement direction, the correlation functions differ from each other greatly between a case where the two signals coincide with each other and another case where the two signals do not coincide with each other. In this case, since such a correlation function includes informations regarding edge positions of the wafer mark, the position of the position detection mark can be detected on the basis of the correlation function with higher accuracy than those of conventional position detecting apparatuses.

In this case, it is desirable that the detection signals regarding a plurality of position detection marks successively obtained through the detection optical system (11; 11A) are averaged to provide an average signal (equivalent to the seeking of the added signal) and there is provided a signal emphasizing means (32) for emphasizing the change portion in the average signal, whereby a signal in which the change portion is emphasized by the signal emphasizing means (32) is used as a reference signal. With this arrangement, an emphasized reference signal is formed on the basis of the detection signals detected from the actual position detection marks.

Further, it is desirable that the signal emphasizing means (32) serves to emphasize the change portion in the average signal and to make a shape of the change portion emphasized signal symmetrical in the measurement direction. As a result, even when the position detection mark to be detected is asymmetrical in the measurement direction, the obtained emphasized reference signal becomes symmetrical in the measurement direction, thereby improving the accuracy of the subsequent positional detection.

According to one aspect of the present invention, it is desirable that the signal emphasizing means (32) serves to perform a treatment (convolution calculation) in which a signal corresponding to a predetermined first position of the average signal is multiplied by where A (A is a positive real number), signals corresponding to second and third positions of the average signal spaced apart from the first position by predetermined distances in both forward and backward directions along a measurement direction are multiplied by where B (B is a negative real number), and the signal multiplied by A is added to the signals multiplied by B. By adjusting the values A and B, the degree of emphasis of the average signal can easily be adjusted. In this case, it is desirable that the values A and B satisfy the above-mentioned equation (1).

Further, one embodiment of the position detecting method according to the present invention, comprises the steps of illuminating illumination light onto a position detection mark on a substrate to be treated and of receiving light returned from the position detection mark, and outputting a detection signal corresponding to intensity of the returned light; obtaining an emphasized reference signal by emphasizing at least one change portion in the detection signal; and detecting the position of the position detection mark by using said emphasized reference signal.

Another embodiment of the position detecting method according to the present invention comprises the steps of illuminating the illumination light onto a position detection mark on a substrate to be treated, receiving the light returned from said position detection mark, and outputting a detection signal corresponding to intensity of the returned light; obtaining and storing a predetermined emphasized reference signal in which at least one change portion is emphasized to a greater degree than the detection signal; calculating a correlation function obtained from a correlation between the detection signal and the emphasized reference signal while laterally shifting both the detection signal and the emphasized reference signal relative to each other, and seeking an amount of correlation lateral shift between these two signals when the relative function becomes a predetermined value; and detecting the position of the position detection mark on the basis of the amount of relative lateral shift.

BRIEF DESCRIPTION OF THE DRAWINGS

FIGS. 2A to 2C are views showing wafer marks 13X to be detected by the alignment sensor in FIG. 1;

DESCRIPTION OF THE PREFERRED EMBODIMENTS

The present invention will now be explained in connection with a first embodiment thereof with reference to FIG. 14 and FIGS. 1 to 3. In this embodiment, the present invention is applied to an alignment sensor of an off-axis type and of a laser beam scan type mounted on a projection exposure apparatus.

Figure 14:
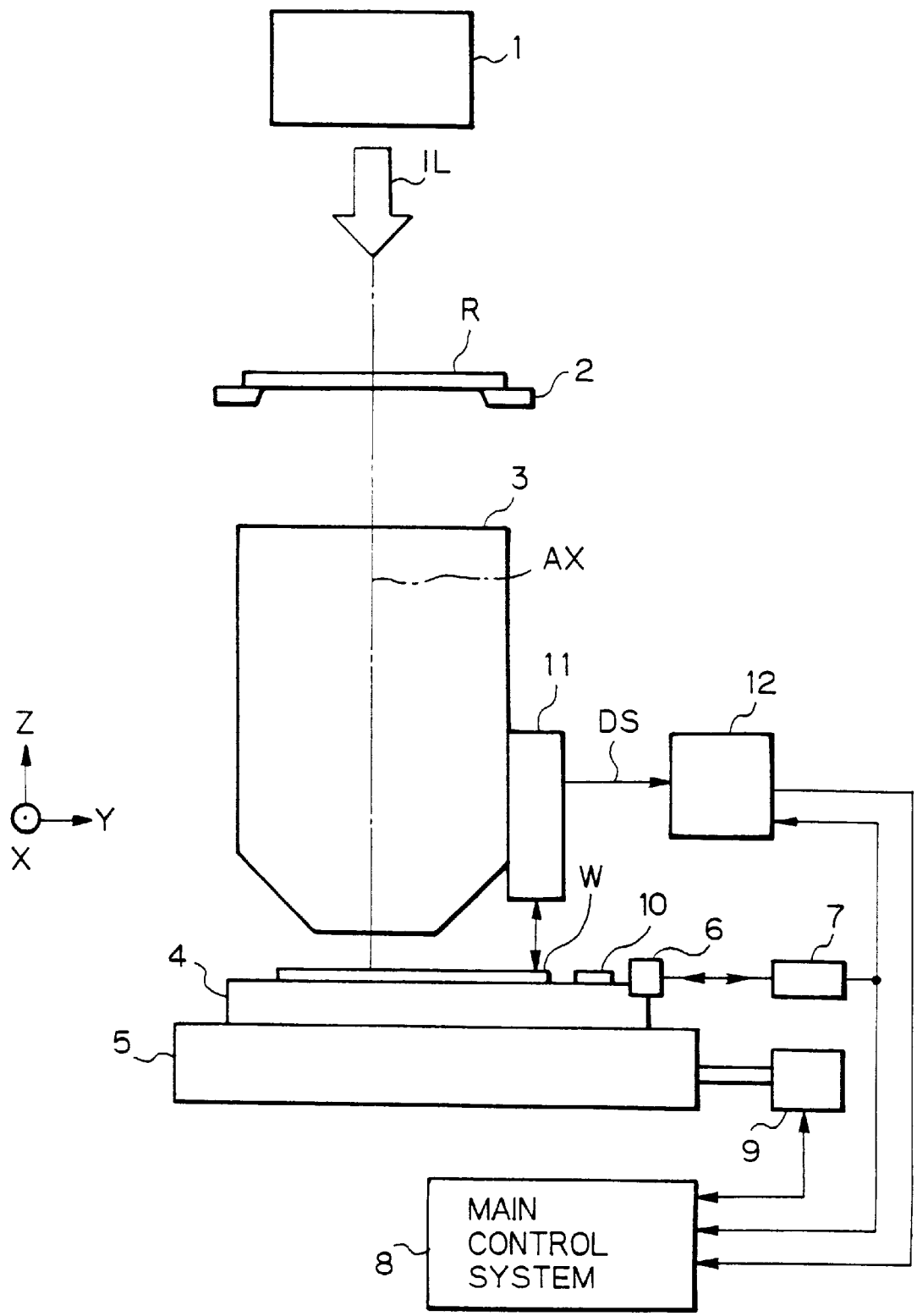
FIG. 14 is a schematic illustration showing a projection exposure apparatus on which the alignment sensor according to any one of the above-mentioned embodiments is mounted.

FIG. 14 shows an example of a projection exposure apparatus of a stepper type having the alignment sensor of this embodiment. In FIG. 14, exposure illumination light (bright ray such as i-ray from a mercury lamp, or, excimer laser beam) IL is illuminated onto a pattern formed on a lower surface (pattern formed surface) of a reticle R with uniform illuminance distribution. The pattern is reduced by projection magnification β (for example, ⅕) by means of a projection optical system 3 and the reduced pattern is projected onto each of shot areas on a semiconductor wafer (referred to merely as "wafer" hereinafter) W on which photoresist is coated. Hereinbelow, a direction parallel to an optical axis AX of the projection optical system 3 is referred to as a Z-axis, a direction perpendicular to the plane of FIG. 14 in a plane perpendicular to the Z-axis is referred to as an X-axis, and a direction parallel with the plane of FIG. 14 is referred to as a Y-axis.

The reticle R is positioned in the X-axis (X direction) and Y-axis (Y direction) and is rotated by a desired angle, and then is fixedly held on a reticle stage 2. On the other hand, the wafer W is held on a specimen plate 4 via a wafer holder (not shown), and the specimen plate 4 is secured to an XY stage 5. A wafer stage is constituted by the wafer holder (not shown), specimen plate 4 and XY stage 5. The XY stage 5 serves to position the wafer W in the X direction and Y direction, and the specimen plate 4 serves to control a position of the wafer W in the Z direction (focus position) and to correct an inclination angle of the wafer W. A reference plate 10 is secured to an upper surface of the specimen plate 4 in such a manner that a surface of the reference plate becomes flush with a surface of the wafer W, and a reference mark used in base line measurement (measurement of a distance between the optical axis AX of the projection optical system 3 and a detection center of the alignment sensor) is formed on the surface of the reference plate 10.

By using a shiftable mirror 6 secured to the specimen plate 4 and a laser interferometer 7 opposed to the shiftable mirror, an X-coordinate value and a Y-coordinate value of the specimen plate 4 are always measured with a resolving power of the order of 0.01 μm. A coordinate system determined on the basis of the coordinate values measured by the laser interferometer 7 is called as a stage coordinate system (X, Y). The coordinate values measured by the laser interferometer 7 are supplied to a main control system 8 for controlling an operation of the entire apparatus and an alignment signal treatment system 12 (described later), so that the main control system 8 controls the positioning of the XY stage 5 via a wafer stage drive system 9 on the basis of the supplied coordinate values. More specifically, when the exposure to a certain shot area on the wafer W is finished, a next shot area is positioned within an exposure field of the projection optical system 3 by shifting the XY stage 5 steppingly and then the next shot area is exposed (step-and-repeat exposure).

The projection exposure apparatus of FIG. 14 is provided with an alignment sensor for detecting coordinates of a wafer mark as a position detection mark formed on each shot area of the wafer W, which alignment sensor comprises an alignment optical system 11 of off-axis type and of laser beam scan type and an alignment signal treatment system 12. The details of the alignment sensor will be described later.

A detection signal DS which is photoelectrically converted by and outputted from the alignment optical system 11 is supplied to the alignment signal treatment system 12 to which the coordinate value of the specimen plate 4 measured by the laser interferometer 7 is also supplied. In the alignment signal treatment system 12, by seeking the coordinate value of the specimen plate 4 when the detection signal DS becomes a predetermined condition which will be described later, the coordinate value of the wafer mark (to be detected) in the stage coordinate system is detected, which coordinate value is in turn supplied to the main control system 8. Further, the base line distance which is a distance between the detection center of the alignment optical system 11 and the optical axis AX (exposure center) of the projection optical system 3 is previously sought by using the reference plate 10 and is stored in a memory device of the main control system 8. Accordingly, the main control system 8 can drive the XY stage 5 on the basis of a coordinate value obtained by correcting the supplied coordinate value of the wafer mark with the base line distance, thereby accurately aligning a center of the shot area to which the wafer mark belongs with the exposure center.

Next, a construction of the alignment sensor of laser beam scan type according to the first embodiment will be fully explained. Hereinbelow, although a mechanism for detecting an X-axis position detection mark will be described, a Y-axis position detection mark can be detected by a similar mechanism.

Figure 1:
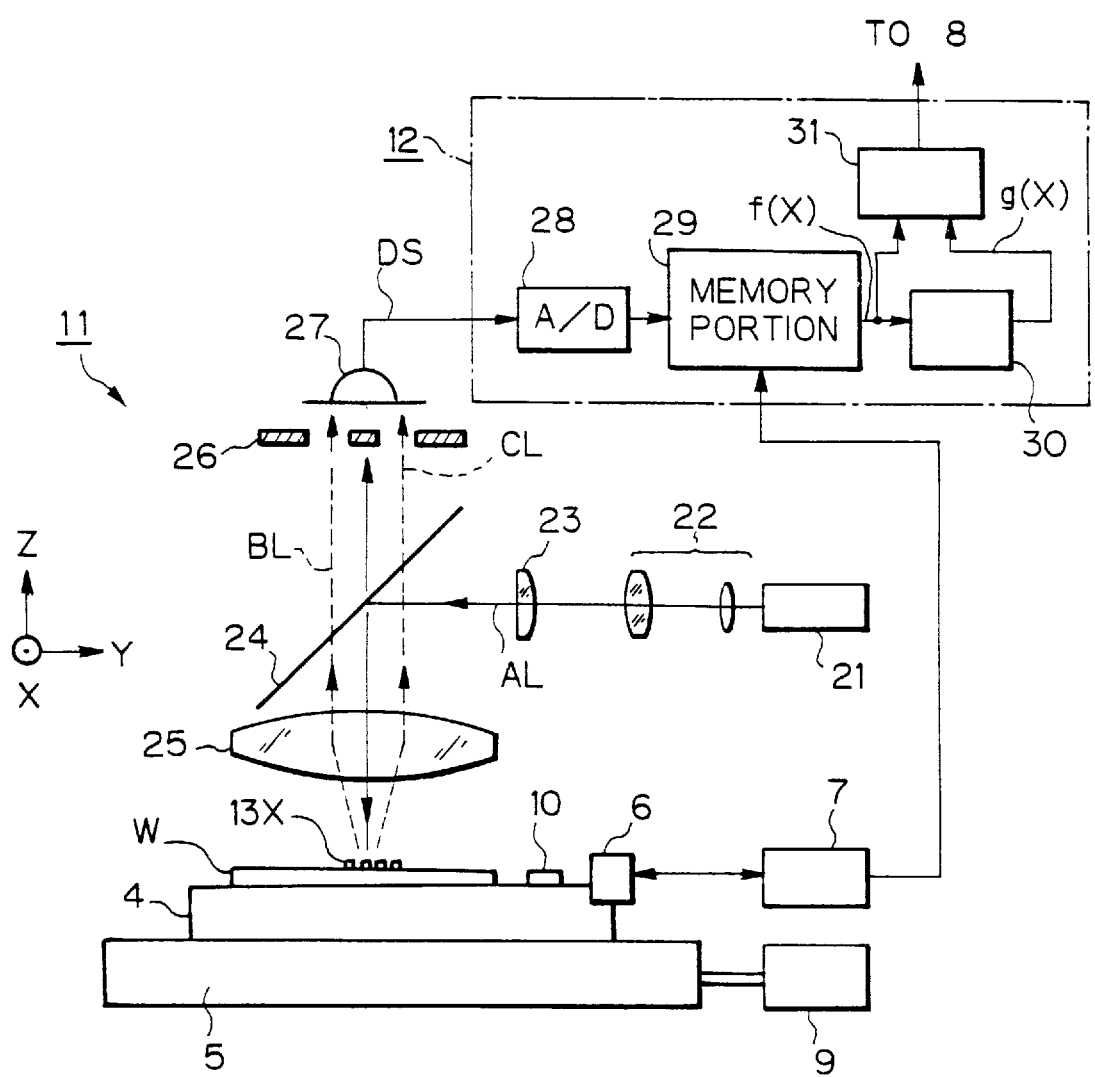
FIG. 1 is a diagram showing an alignment sensor as a position detecting apparatus and method according to a first embodiment of the present invention.

FIG. 1 schematically shows constructions of the alignment optical system 11 and the alignment signal treatment system 12 according to the first embodiment. In the alignment optical system 11 shown in FIG. 1, a laser beam AL having a wavelength of λ and emitted from a laser light source 21 is collected in the vicinity of an X-axis wafer mark (as a position detection mark on the wafer W) in a sheet-shaped fashion through a beam shaping lens system 22, a cylindrical lens 23, a half mirror 24 and an objective lens 25. The laser beam AL may be a laser beam having a wavelength band which is not photosensitive to the photoresist on the wafer W (for example, laser light having a wavelength of 633 nm and outputted from a He—Ne laser light source or a laser beam outputted from a laser diode). Incidentally, when a resist pattern after development is to be detected, there is no limitation to the wavelength band of the laser beam AL.

FIG. 2A is an enlarged plan view showing the X-axis wafer mark 13X, FIG. 2B is an enlarged sectional view taken along the line B—B in FIG. 2A, and FIG. 2C is a sectional view taken along the line C—C in FIG. 2A. As shown in FIG. 2A, the wafer mark 13X is formed by arranging a plurality of square recesses (for example, 4 $\mu$m×4 $\mu$m) with a pitch of about 8 $\mu$m along the Y direction perpendicular to the X direction (measurement direction). In this case, as shown in FIG. 2B, a bottom surface 13Xa of a central recess of the wafer mark 13X is inclined at an angle of $\theta$ (as an error) along the measurement direction to provide an asymmetrical condition, and other recesses similarly are asymmetrical in the measurement direction. Further, as shown in FIG. 2C, the bottom surfaces (13Xa and the like) of the recesses of the wafer mark 13X are symmetrical in a non-measurement direction (Y direction), but an amount of level difference of the unevenness is considerably small.

The laser beam collected in the vicinity of the wafer mark 13X of FIG. 2A through the objective lens 25 is collected in a sheet-shaped (similar to the wafer mark 13X) fashion along the Y direction perpendicular to the measurement direction, and a width of the sheet-shaped light collected area along the measurement direction (shorter side direction) is about 3 $\mu$m, for example. By driving the XY stage 5 shown in FIG. 1 in the X direction, as the wafer W is scanned so that the wafer mark 13X is shifted across the laser beam AL in the measurement direction, when the wafer mark 13X and the laser beam AL at least partially with each other, diffraction light is generated from the wafer mark 13X along the non-measurement direction due to the periodic feature.

As shown in FIG. 1, diffraction light beams BL, CL and a specular reflection light beam generated from the wafer mark 13X in the non-measurement direction are sent, through the objective lens 25 and the half mirror 24, to a spacial filter 26, where the specular reflection light from the wafer W is removed. Then, the diffraction light beams BL, CL are incident on a photoelectric detector 27 comprised of a photodiode. In the photoelectric detector 27, the diffraction light beams BL, CL are photo-electrically converted to provide detection signals DS corresponding to a change in intensity of the diffraction light beams. The alignment optical system 11 is constituted by the elements 21–27 (from the laser light source 21 to the photoelectric detector 27), and the detection signals DS are supplied to the alignment signal treatment system 12. Incidentally, the construction of the alignment optical system 11 is the same as that of an optical system of a conventional alignment sensor of an LSA (laser-step-alignment) type.

In the alignment signal treatment system 12 according to the illustrated embodiment, the detection signal DS from the photoelectric detector 27 is supplied to a memory portion 29 through an analog/digital (A/D) converter 28, and the coordinate value from the laser interferometer 7 is also supplied to the memory portion 29. In the memory portion 29, digital data of the detection signal DS are stored in the memory in a manner such that the data correspond to the X-coordinate value of the specimen plate 4 measured by the laser interferometer 7. The digital data of the detection signal DS which are represented as a function of the X-coordinate value of the specimen plate 4 referred to as a mark detection signal f(X). The mark detection signal f(X) read out from the memory portion 29 is supplied to a signal emphasizing portion 30 and a signal treatment portion 31. In the signal emphasizing portion 30, an emphasized signal in which the change portion in the mark detection signal f(X) is emphasized is generated, which emphasized signal is supplied to the signal treatment portion 31. In the signal treatment portion 31, the X-coordinate value of the specimen plate 4 (wafer W) when the laser beam AL coincides with the wafer mark 13X along the X direction is determined by using the mark detection signal f(X) and the emphasized signal g(X), and this X-coordinate value is supplied to the main control system 8 of FIG. 14 as an X-coordinate value of the wafer mark 13X.

Next, operations of the signal emphasizing portion 30 and of the signal treatment portion 31 will be explained. In the illustrated embodiment, as indicated by the bottom surface 13Xa shown in FIG. 2B, each of the bottom surfaces of the recesses of the wafer mark 13X is inclined at an angle of $\theta$ (as an error) in the measurement direction. When the wafer mark 13X is asymmetrical in the measurement direction in this way, the mark detection signal f(X) which is the digital data of the detection signal DS outputted from the photoelectric detector 27 of FIG. 1 also becomes asymmetrical, with the result that a position detection value has an error. An example of such a mark detection signal f(X) is shown in FIG. 3A.

Figure 3A:
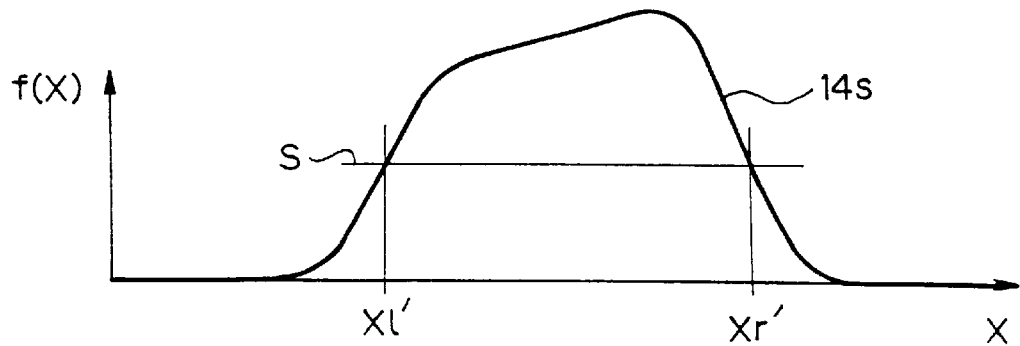
FIG. 3A is a graph showing a waveform of a mark detection signal f(X) to be treated by an alignment signal treatment system 12 in FIG. 1.

In FIG. 3A, the abscissa indicates the X-coordinate value of the specimen plate 4 and the ordinate indicates the value of the mark detection signal f(X) corresponding to the respective X-coordinate value. As shown by the solid curve 14s, the mark detection signal f(X) is asymmetrical along the measurement direction (X direction). To the contrary, in the conventional techniques, a certain slice level S was determined regarding such a mark detection signal f(X), and a position where the mark detection signal f(X) was sliced at the slice level S, i.e., an average position of X-coordinates Xl', Xr' of two intersections between the slice level S and the mark detection signal f(X) was regarded as the detection position of the wafer mark 13X. Alternatively, a correlation between a reference signal (particular template signal) represented by a particular function of the X-coordinate value and the mark detection signal f(X) or a self-relation of the mark detection signal f(X) was determined, and an X-coordinate value in which the correlation becomes maximum was regarded as the detection position of the wafer mark 13X. However, because of the asymmetry due to the inclination of the bottom surfaces of the wafer mark 13X, if the mark detection signal f(X) becomes asymmetrical to the extent shown by the curve 14s in FIG. 3A, it will be difficult for the conventional slice method or correlation method to calculate the mark position with adequate accuracy.

Figure 3B:
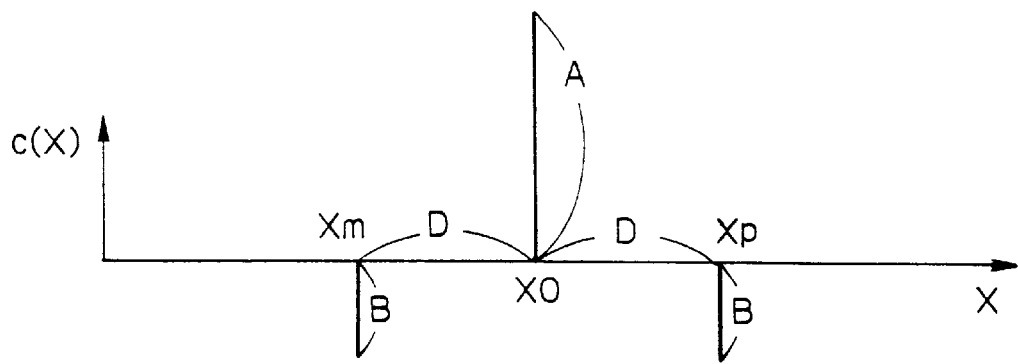
FIG. 3B is a graph showing a numerical number filter c(X) used in a signal emphasizing portion 30.

To avoid this, according to the illustrated embodiment, in the signal emphasizing portion 30 of the alignment signal treatment system 12, in order to emphasize the change portion in the mark detection signals f(X) corresponding to edge portions of the wafer mark 13X, for example, by using a numerical filter c(X) having a property shown in FIG. 3B, convolution calculation of the mark detection signal f(X) is performed.

In FIG. 3B, the abscissa indicates the X-coordinate value and the ordinate indicates a value of the numerical filter c(X). The value of the numerical filter c(X) in FIG. 3B is A (A is a positive real number) at a reference point X0 on the abscissa (X-coordinate), and the values of the filter are B (B is a negative real number) at two points (having coordinate values Xp, Xm, respectively) spaced apart from the reference point X0 by a distance of D in both forward and backward directions along the X direction. The values A and B are selected to satisfy the following equation (1). This is introduced in order to emphasize only the change components at both edge portions without changing the average level of the mark detection signal f(X).

$$A+2B=1 \qquad (1)$$

The distance D is about 0.3 μm, for example, but the distance may have any other value depending upon the waveform of the mark detection signal f(X). Alternatively, the distance D is not set as a length but may be set as a value corresponding to the multiple of the resolving power of the laser interferometer 7 of FIG. 1, for example. In the signal emphasizing portion 30, regarding the mark detection signal f(X), by performing the convolution calculation of the numerical filter c(X) by using the following equation (2), the emphasized signal g(X) is calculated:

$$g(X) = \int_{-\infty}^{\infty} f(t) \cdot c(X-t) dt \qquad (2)$$

Figure 3C:
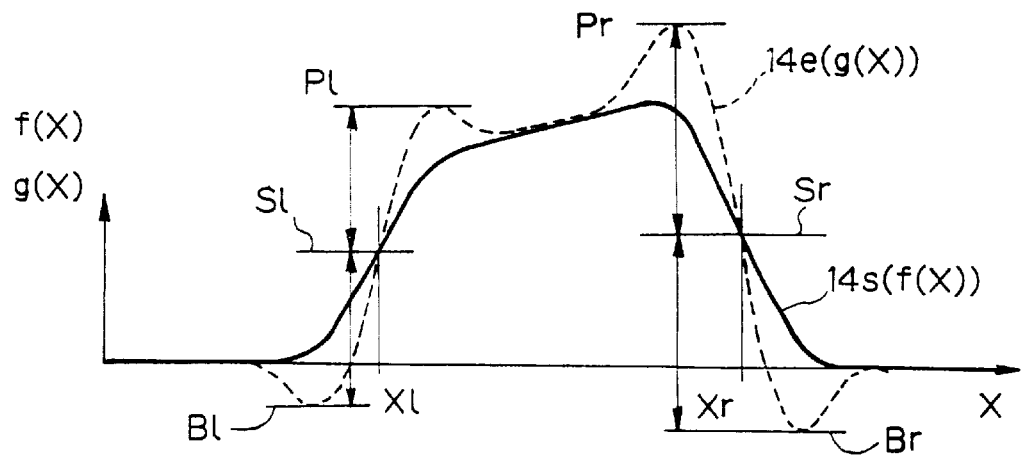
FIG. 3C is a graph showing a waveform of an emphasis signal g(X) outputted from the signal emphasizing portion 30.

As indicated by the broken line curve 14e in FIG. 3C, the emphasized signal g(X) obtained by the convolution calculation becomes a signal which emphasizes the change components in the edge portions of the mark detection signal f(X) as indicated by the solid line curve 14s. Both edge portions so emphasized correspond to both edge portions of the wafer mark 13X in the measurement direction. In the signal treatment portion 31 in FIG. 1, peak values Pl, Pr and bottom values Bl, Br of the emphasized edge portions of the emphasized signal g(X) are sought. Regarding these peak values Pl, Pr and bottom values Bl, Br, maximum values and minimum values of the emphasized signal g(X) in the vicinity of two positive and negative maximum inclination points of the emphasized signal g(X) (or mark detection signal f(X)) corresponding to left and right edge portions may be sought.

Thereafter, from the peak values Pl, Pr and bottom values Bl, Br at both edge portions, slice levels Sl, Sr at both edge portions are determined independently. More specifically, the slice level Sl at the left edge portion and the slice level Sr at the right edge portion are determined by using a coefficient a on the basis of the following equations (3) and (4):

$$Sl=Bl+\alpha(Pl-Bl) \qquad (3)$$

$$Sr=Br+\alpha(Pr-Br) \qquad (4)$$

In this case, the coefficient α is a real number from 0 to 1 and can be previously inputted by an operator Similarly, the values A and B in the above equation (2) may be inputted to the apparatus by the operator.

For example, when the coefficient α is set to be ½, the slice levels Sl, Sr have an intermediate values between the peak values Pl, Pr and bottom values Bl, Br, as indicated by the following equations (5) and (6):

$$Sl=(Pl+Bl)/2 \qquad (5)$$

$$Sr=(Or+Br)/2 \qquad (6)$$

On the basis of the slice levels Sl, Sr so determined, in the signal treatment portion 31, the mark detection signal f(X) is sliced, and an average position of X-coordinate values Xl, Xr of the intersections between the slice levels Sl, Sr and the mark detection signal f(X) is regarded as the detection position of the wafer mark 13X. In this way, both edge portions of the mark detection signal f(X) can be sliced at the optimum slice levels, thereby minimizing the position detection error of the wafer mark 13X.

Incidentally, in the signal treatment portion 31, in place of the mark detection signal f(X), the emphasized signal g(X) may be sliced at the slice levels Sl, Sr and the position of the wafer mark 13X may be determined on the basis of the slice values. In this case, although the obtained detection position slightly differs from the detection position obtained by slicing the mark detection signal f(X), since these detection positions have minute deviation (error) from the actual position (value), high accurate position detection values can be obtained.

Further, by calculating a correlation function between the emphasized signal g(X) and a predetermined function (template) regarding a position in the measurement direction or by calculating a self correlation function of the emphasized signal g(X), a position where the correlative becomes maximum can be determined as the mark position. Since the emphasized signal g(X) includes edge information stronger than that of the mark detection signal f(X), more accurate position detection value than that obtained by the conventional relation methods can be obtained.

The signal emphasizing treatment effected in the signal emphasizing portion 30 according to the illustrated embodiment is not limited to the above-mentioned convolution calculation performed by using the numerical filter. For example, the mark detection signal f(X) may be Fourier-converted and a component of the converted result having a value greater than a predetermined spacial frequency may be increased by predetermined times, and then the increased component may be reverse-Fourier-converted. In this case, only the change component among the mark detection signal f(X) can be emphasized. Alternatively, before the detection signal DS corresponding to the intensity of the detection light from the photoelectric detector 27 is A/D-converted, a component having a value greater than a predetermined frequency may be amplified (high frequency emphasis) by means of an analog circuit. When the treatment is effected by the analog circuit in this way, the scanning speed of the XY stage 5 may be constant so that the high frequency component of the detection signal DS may be emphasized along a time axis.

Further, the numerical filter c(X) is not limited to the shape shown in FIG. 3B, but may have any shape so long as the edges of the wafer mark can be emphasized. However, when the mark detection signal f(X) is sliced at the slice levels Sl, Sr determined on the basis of the emphasized signal g(X) and the average value of the slice values is used as the detection position of the wafer mark 13X, it is desirable that an integrated value of the numerical filter c(X) becomes 1.

When the alignment sensor according to the illustrated embodiment is used, similar to the conventional techniques, before the position detection is performed, it is necessary to measure a positional relation between the illumination position of the detection laser beam AL and the optical axis AX (exposure center) of the projection optical system 3 in FIG. 14. This measurement is a treatment called as a base line check. In the illustrated embodiment, as an example, a reference mark (not shown) having the same shape as that of the wafer mark 13X is formed on the surface of the reference plate 10 secured to the specimen plate 4 in FIG. 14, and, when the reference mark is positioned at the exposure center, an X-coordinate value $X_1$ of the specimen plate 4 is previously measured and stored. And, for example, before the wafer W is exposed, the XY stage 5 is driven to shift the reference mark below the alignment optical system 11, and an X-coordinate value $X_2$ of the reference mark at this position is detected by the alignment optical system 11. A difference ($X_1$–$X_2$) between two X-coordinate values is stored as a base line distance. Similarly, regarding the Y-axis alignment sensor, a Y-axis base line distance is determined and stored.

Thereafter, when the X-coordinate value of the wafer mark 13X is detected, since a value obtained by adding the base line distance to the detected value becomes the exposure center, the X-coordinate of the shot area to which the wafer mark 13X belongs can be positioned at the exposure center correctly (correct alignment). Similarly, after the alignment regarding the Y direction is performed, superimpose exposure is effected. In the actual alignment, not only die-by-die alignment wherein the position of the wafer mark for each of shot areas is detected but also enhanced-global alignment (EGA) wherein positions of shot areas (sample shots) selected among all of the shot areas are measured and the measured result is treated to determine an arrangement coordinate system of all of the shot areas can be used. Such alignment techniques can also be used in other embodiments which will be described later.

Figure 4:
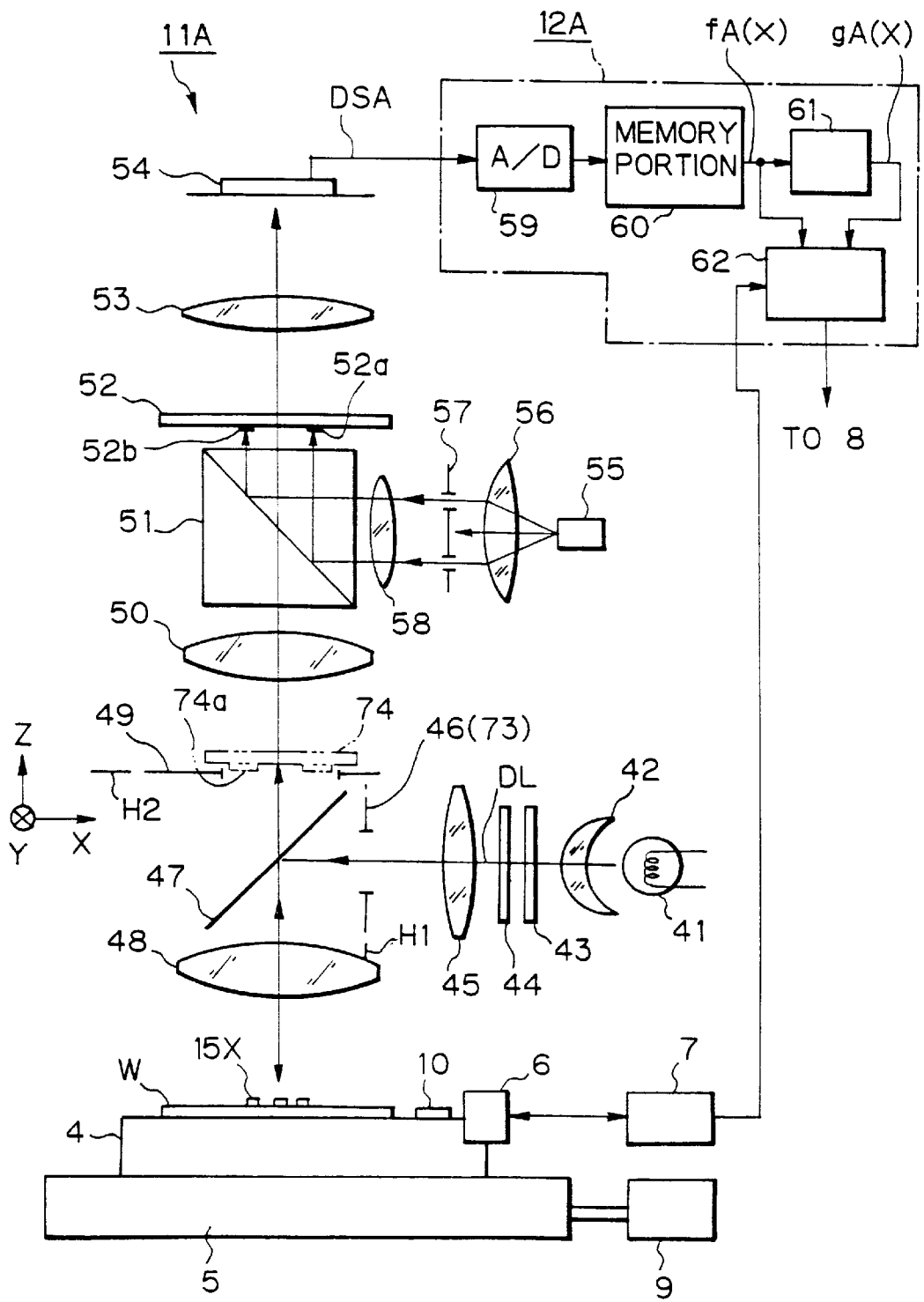
FIG. 4 is a diagram showing an alignment sensor as a position detecting apparatus according to a second embodiment of the present invention.

Next, a second embodiment of the present invention will be explained with reference to FIGS. 4 to 6. In this embodiment, the present invention is applied to an alignment sensor of off-axis type and of image forming position detecting type provided within a projection exposure apparatus. In the projection exposure apparatus according to this embodiment, the alignment optical system 11 and alignment signal treatment system 12 in FIG. 14 are replaced by an alignment optical system 11A and an alignment signal treatment system 12A, respectively, as shown in FIG. 4. In FIGS. 4 to 6, elements corresponding to those shown in FIGS. 1–3 and 14 are designated by the same reference numerals and explanation thereof will be omitted.

FIG. 4 shows a schematic construction of the alignment sensor according to this embodiment. Unlike to FIG. 1, in FIG. 4, an X-axis is defined in parallel with the plane in FIG. 4 and a Y-axis is defined in perpendicular to the plane of FIG. 4. In FIG. 4, broadband illumination light (wide band light) emitted from a light source 41 such as a halogen lamp is incident on an illumination field stop 44 through a condenser lens 42 and a wavelength selection element (sharp cut filter or interference filter) 43.

The wavelength selection filter 43 serves to pass only luminous flux having a wavelength band (for example, wavelength of 550 nm–759 nm) non-photosensitive to the photoresist (receiving exposure wavelength of 365 nm or 248 nm, for example) coated on the wafer W. However, when the alignment sensor according to this embodiment is applied to a position detecting apparatus for a substrate which is not coated by the photoresist (for example, a detecting apparatus for detecting an error in overlap between the circuit pattern on the wafer after both exposure and development operations and the transferred resist pattern), since there is no need to prevent the exposure of the photoresist, luminous flux having shorter wavelength (near the exposure wavelength) can also be used.

The illumination light Dl passed through a permeable portion of the illumination field stop 44 is incident on an illumination aperture stop 46 through a relay lens 45. Then, the illumination light DL is incident on an illumination area including an X-axis wafer mark 15X (as a position detection mark) on the wafer W through a beam splitter 47 and an objective lens 48. The illumination aperture stop 46 is disposed on a plane (referred to as "illumination pupil plane" hereinafter) H1 having optical Fourier transform relation regarding the surface of the wafer W (wafer mark 15X) via the objective lens 48 and the beam splitter 47.

The illumination field stop 44 has a substantial conjugate relation (image forming relation) to the surface of the wafer W (wafer mark 15X) so that the illumination area on the wafer W can be limited on the basis of the shape and dimension of the permeable portion of the illumination field stop 44. The wafer W is held on the specimen plate 4 via a wafer holder (not shown) and the specimen plate 4 is rested on the XY stage 5. The construction of these elements is the same as that shown in the first embodiment.

The luminous flux reflected by the illumination area (on the wafer W) including the wafer mark 15X is sent to an image forming aperture stop 49 disposed on a plane (referred to as "image forming pupil plane" hereinafter) H2 having optical Fourier transform relation regarding the surface of the wafer W via the objective lens 48 and the beam splitter 47. The light flux passed through the image forming aperture stop 49 is collected by an image forming (focusing) lens 50 and the collected light is passed through a beam splitter 51 to reach an index plate 52, thereby forming an image of the wafer mark 15X on the index plate.

Index marks 52a, 52b are formed on the index plate 52. An index plate illuminating system is constituted by a light source such as a light emitting diode (LED), a condenser lens 56, an index illumination field stop 57, lens 58 and the like. The index plate illuminating system is so set that the illumination light from this system is illuminated onto only a partial area including the index marks 52a, 52b through the beam splitter 51. Further, the permeable portion of the illumination field stop 44 is so configured that the illumination light does not illuminate (i.e. shields) the area including the index marks 52a, 52b. Thus, the image of the wafer mark 15X does not overlap with the index marks 52a, 52b.

The luminous flux from the image of the wafer mark 15X formed on the index plate 10 and the index marks 52a, 52b is collected onto an imaging elements 54 such as a CCD through a relay lens 53, with the result that the image of the wafer mark 15X and images of the index marks 52a, 52b are formed on an imaging plane of the imaging element 54. The alignment optical system 11A is constituted by the light source 41 through the imaging element 54, and an imaging signal DSA from the imaging element 54 is supplied to the alignment signal treatment system 12A.

In the alignment signal treatment system 12A according to the illustrated embodiment, the imaging signal DSA is supplied to a memory portion 60 through an A/D converter 59. In the memory portion 60, digital data of the imaging signal DSA are successively stored in a memory. In this case, in the imaging element 54, the imaging signal is read out (i.e. scanned) in a direction corresponding to the measurement direction (X direction) of the wafer mark 15X. Thus, it is already known which data in the X, Y directions on a coordinate system having an origin situated at a position (on the wafer W) conjugate with a pixel as a reference for the imaging element 54 corresponds to each of the digital data of the imaging signal DSA, from the projection magnification (from the surface of the wafer W to the imaging plane of the imaging element 54) and pitches between the pixels in the scanning direction and non-scanning direction of the imaging element 54. However, in the illustrated embodiment, since the index marks 52a, 52b act as the reference for the measurement position, there is no need to accurately seek the position of the pixel as the reference for the imaging element 54. Hereinbelow, the digital data of the imaging signal DSA corresponding to one scan signal stored in the memory portion 60 are called as a mark detection signal fA(X) corresponding to an X-coordinate value on the wafer W.

The mark detection signal fA(X) read out from the memory portion 60 is supplied to a signal emphasizing portion and a signal treatment portion 62. In the signal emphasizing portion 61, an emphasized signal gA(X) in which the change portion in the mark detection signal fA(X) is emphasized is generated, and the emphasis signal is supplied to the signal treatment portion 62. In the signal treatment portion 62, by using the mark detection signal fA(X) and the emphasis signal gA(X), a positional deviation amount ΔX of the wafer mark 15X with respect to the index marks 52a, 52b in the X direction. The X-coordinate value of the specimen plate 4 measured by the laser interferometer 7 is also supplied to the signal treatment portion 62. In the signal treatment portion 62, a value obtained by adding the positional deviation amount ΔX to the X-coordinate value from the laser interferometer 7 is determined as an X-coordinate value of the wafer mark 15X, and this X-coordinate value is supplied to the main control system 8 of FIG. 14.

Next, a construction of the wafer mark 15X and operations of the signal emphasizing portion 61 and the signal treatment portion 62 according to the illustrated embodiment will be explained.

Figure 5A:
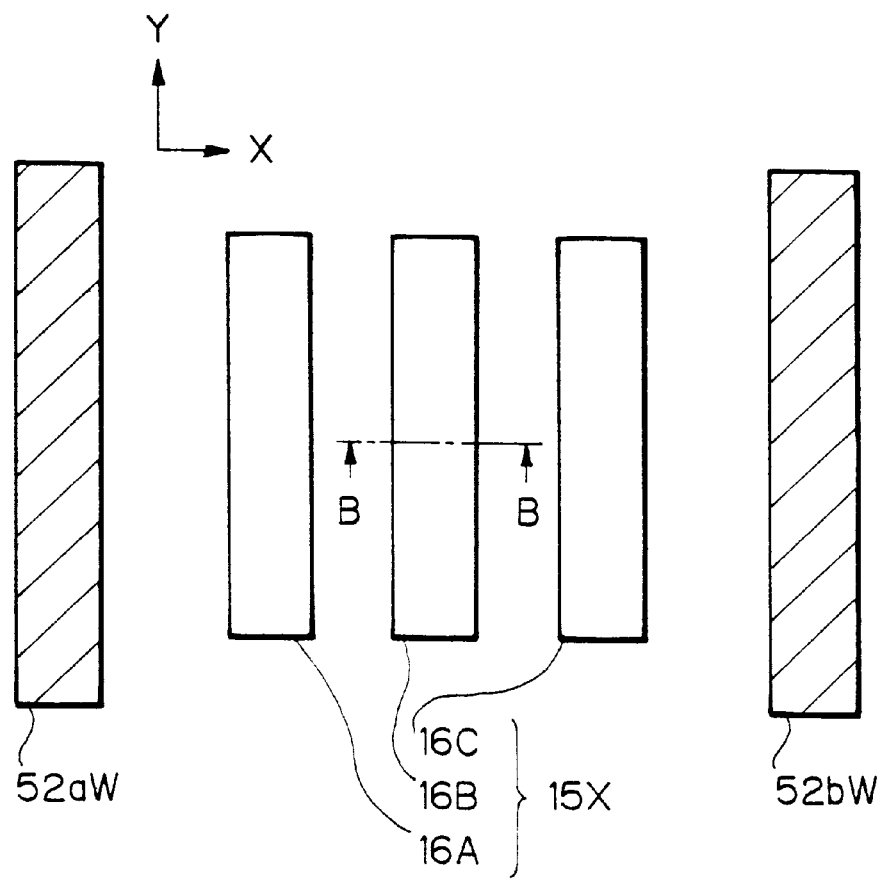
FIGS. 5A and 5B are views showing wafer marks 15X to be detected by the alignment sensor of FIG. 4.

FIG. 5A is an enlarged plan view of the wafer mark 15X. In FIG. 5A, for example, the wafer mark 15X comprises a line-and-space pattern in which rectangular recessed portions 16A, 16B, 16C (elongated in the Y direction) each having a line width of 6 μm are disposed side by side along the X direction (measurement direction) with a pitch of 12 μm. Imaginary index mark images 52aW, 52bW conjugate to the index marks 52a, 52b of the index plate 52 on the wafer W are also shown in FIG. 5A.

Figure 5B:
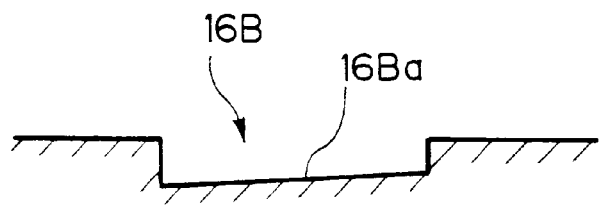

FIG. 5B is an enlarged sectional view taken along the line B—B in FIG. 5A. As shown in FIG. 5B, a bottom surface 16Ba of the recessed portion 16B forming a part of the wafer mark 15X is inclined (as an error) in the measurement direction (X direction), so that the recessed portion is asymmetrical in the measurement direction. Similarly, each of the other recessed portions 16A, 16C also is asymmetrical in the measurement direction. It is assumed that amounts of level difference (amount of depth) of the recessed portions 16A–16C become very shallow (about 10 nm) by flattening the surface of the wafer. Regarding the recessed portions 16A–16c of the wafer mark 15X, the image formed on the imaging element 54 has very low contrast, as indicated by the curve 17s in FIG. 6A.

Figure 6A:
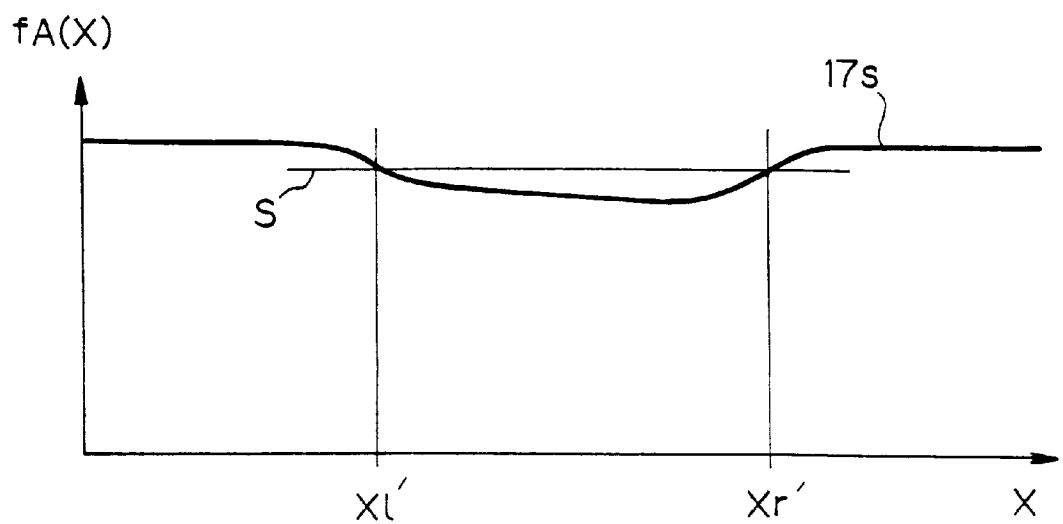
FIG. 6A is a graph showing a waveform of a mark detection signal fA(X) to be treated by an alignment signal treatment system 12A in FIG. 4.
Figure 6B:
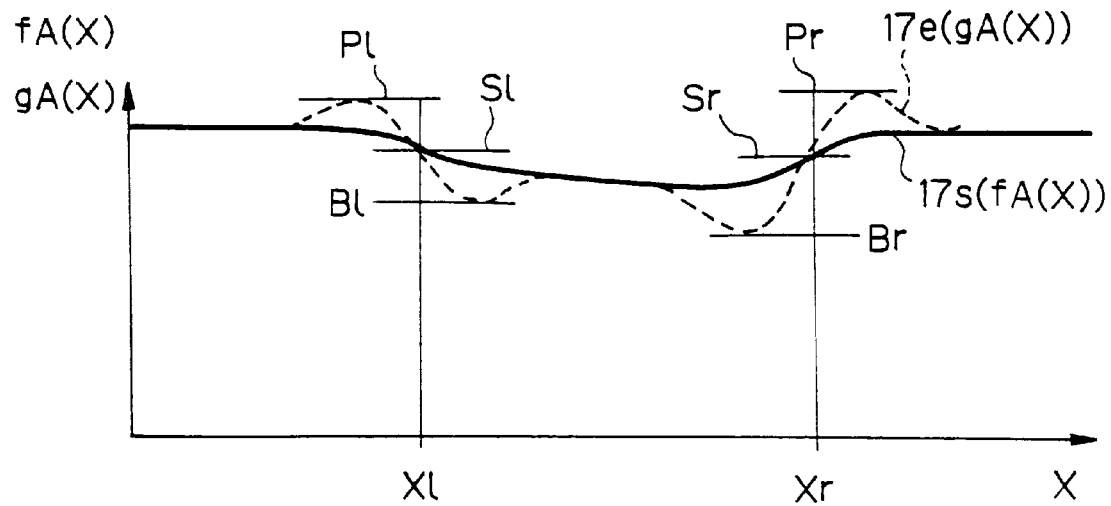
FIG. 6B is a graph showing a waveform of an emphasis signal gA(X) outputted from a signal emphasizing portion 61.

That is to say, FIG. 6A shows the mark detection signal fA(X) read out from the memory portion 60 of FIG. 4, and the abscissa in FIG. 6A indicates an X-coordinate value on the wafer W (the origin is appropriately selected) and the ordinate indicates a value of the mark detection signal fA(X). As indicated by the curve 17s, although the mark detection signal fA(X) has low contrast, such a low contrast is caused by the very shallow amount of level difference of the wafer mark 15X. Regarding such an image, in the conventional techniques in which the coordinate values Xl', Xr' of the intersections between the mark detection signal fA(X) and the slice level by using a single slice level S, it is difficult to detect the position of the mark with high accuracy. To avoid this, in the signal emphasizing portion 61 according to the illustrated embodiment, by using the numerical filter c(X) as shown in FIG. 3B, the change portion in the mark detection signal fA(X) is emphasized, thereby obtaining an emphasis signal gA(X) as indicated by the broken line curve 17e in FIG. 6B. The emphasized signal gA(X) and the mark detection signal fA(X) are supplied to the signal treatment portion 62 of FIG. 4.

In the signal treatment portion 62, as is in the first embodiment, slice levels Sl, Sr at both edge portions of the emphasized signal gA(X) are independently determined by using the above equations (3) and (4) on the basis of the peak values Pl, Pr and the bottom values Bl, Br at the edge portions. On the basis of the slice levels Sl, Sr so determined, in the signal treatment portion 62, an average position of X-coordinates Xl, Xr of intersections between the slice levels Sl, Sr and the mark detection signal fA(X) (or the emphasized signal gA(X)) is regarded as the detection position of the respective recessed portion of the wafer mark 15X.

In this way, the average positions of the recessed portions 16A–16C of the wafer mark 15X of FIG. 5A are determined and an average value of these three average positions is regarded as the X-coordinate value of the wafer mark 15X. Then, a positional deviation amount ΔX between an average position of the images of index marks 52aW, 52bW in the X direction and the X-coordinate value is sought. Also in this embodiment, both edge portions of the mark detection signal fA(X) (or the emphasis signal gA(X)) can be sliced at the optimum slice levels, and the position detection error of each recessed portion of the wafer mark 15X can be minimized, thereby detecting the position of the wafer mark 15X with high accuracy.

Incidentally, in the signal treatment portion 62, in place of the slice method, a relation method regarding the emphasis signal gA(X) may be effected to detect the mark position with high accuracy.

Figure 7A:
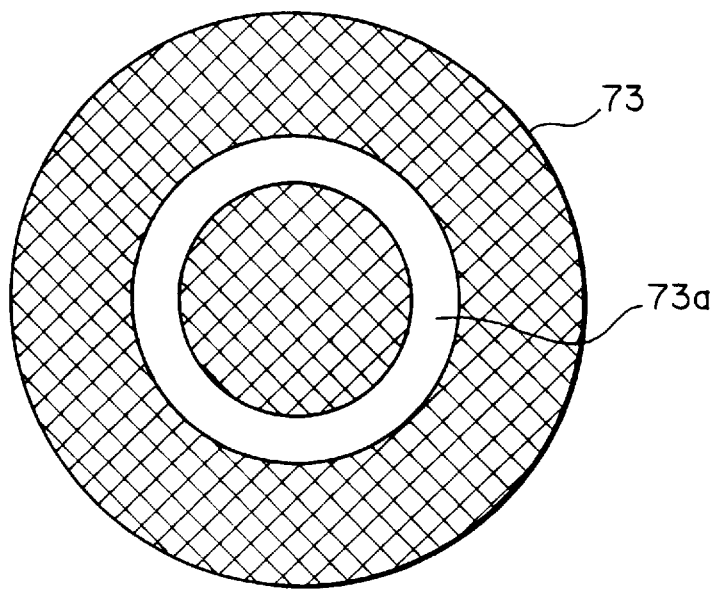
FIG. 7A is a view showing an illumination aperture stop 63 used in a third embodiment of the present invention.

Next, a third embodiment of the present invention will be explained with reference to FIGS. 7 and 4. In this embodiment, while a so-called phase contrast microscope is used as the alignment optical system (detection optical system), a construction of the entire apparatus is fundamentally the same as the alignment sensor according to the second embodiment shown in FIG. 4. However, in place of the illumination aperture stop 46 having the circular permeable portion, an illumination aperture stop 73 having a ring-shaped permeable portion 73a as shown in FIG. 7A is disposed on the illumination pupil plane H1 of FIG. 4 and a phase contrast plate 74 as shown in FIGS. 7B and 7C is disposed on the imaging pupil plane H2 in the vicinity of the imaging aperture stop 49.

Figure 7B:
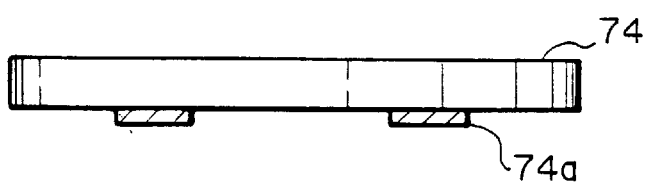
FIG. 7B is a side view showing a phase contrast plate 64 used in the third embodiment.
Figure 7C:
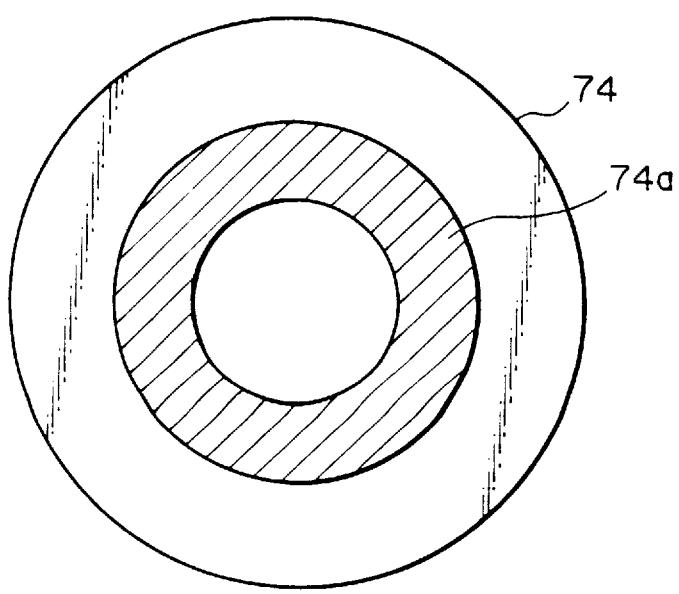
FIG. 7C is a bottom view of the phase contrast plate in FIG. 7B.

FIG. 7B is a front view of the phase contrast plate 74 and FIG. 7C is a bottom view of the phase contrast plate. The phase contrast plate 74 is formed by coating a ring-shaped phase contrast providing portion 74a on a bottom surface of a circular glass substrate. In FIG. 4, the imaging aperture stop 49 and the illumination aperture stop 73 have a conjugate relation via the objective lens and the wafer, and the ring-shaped permeable portion 73a of the illumination aperture stop 73 is so set that an image of the permeable portion is focused within the ring-shaped phase contrast providing portion 74a of the phase contrast plate 74.

In the illustrated embodiment, the phase contrast plate 74 is so set that the phase contrast (phase difference) of +π/2 [rad] or −π/2 [rad] is provided between the imaging luminous flux passing through the phase contrast providing portion 74a and the other imaging luminous flux passing through the portion other than the phase contrast providing portion. To achieve this, when the wavelength or center wavelength of the imaging luminous flux is λ, a thin film having index of refraction (n) and a thickness (d) satisfying the following equation (7) may be formed on the phase contrast providing portion 74a (or on other portion):

$$(n-1) \times d = \lambda/4 \tag{7}$$

Further, the phase contrast providing portion 74a may have a beam attenuating function for attenuating the passed luminous flux. That is to say, a light absorbing member such as a metal thin film may be added to the phase contrast providing portion 74a. The other constructions of the alignment optical system and of the alignment signal treatment system are the same as those of the second embodiment.

As mentioned above, when the phase contrast microscope is used as the alignment optical system (detection optical system), even regarding the wafer mark 15X having a very low level amount of difference, a high contrast detection image can be obtained. However, if the bottom surface of the recessed portion of the wafer mark 15X is asymmetrical (inclination) in the measurement direction, the image obtained by the imaging element 54 will become asymmetrical.

However, in the illustrated embodiment, by emphasizing the detected imaging signal, even regarding the asymmetrical image obtained from the phase contrast microscope, the mark position can be calculated correctly, as is in the first and second embodiments. Incidentally, since the imaging signal emphasizing method and the mark position calculating method according to this embodiment are the same as those in the first and second embodiments, explanation thereof will be omitted.

Figure 8:
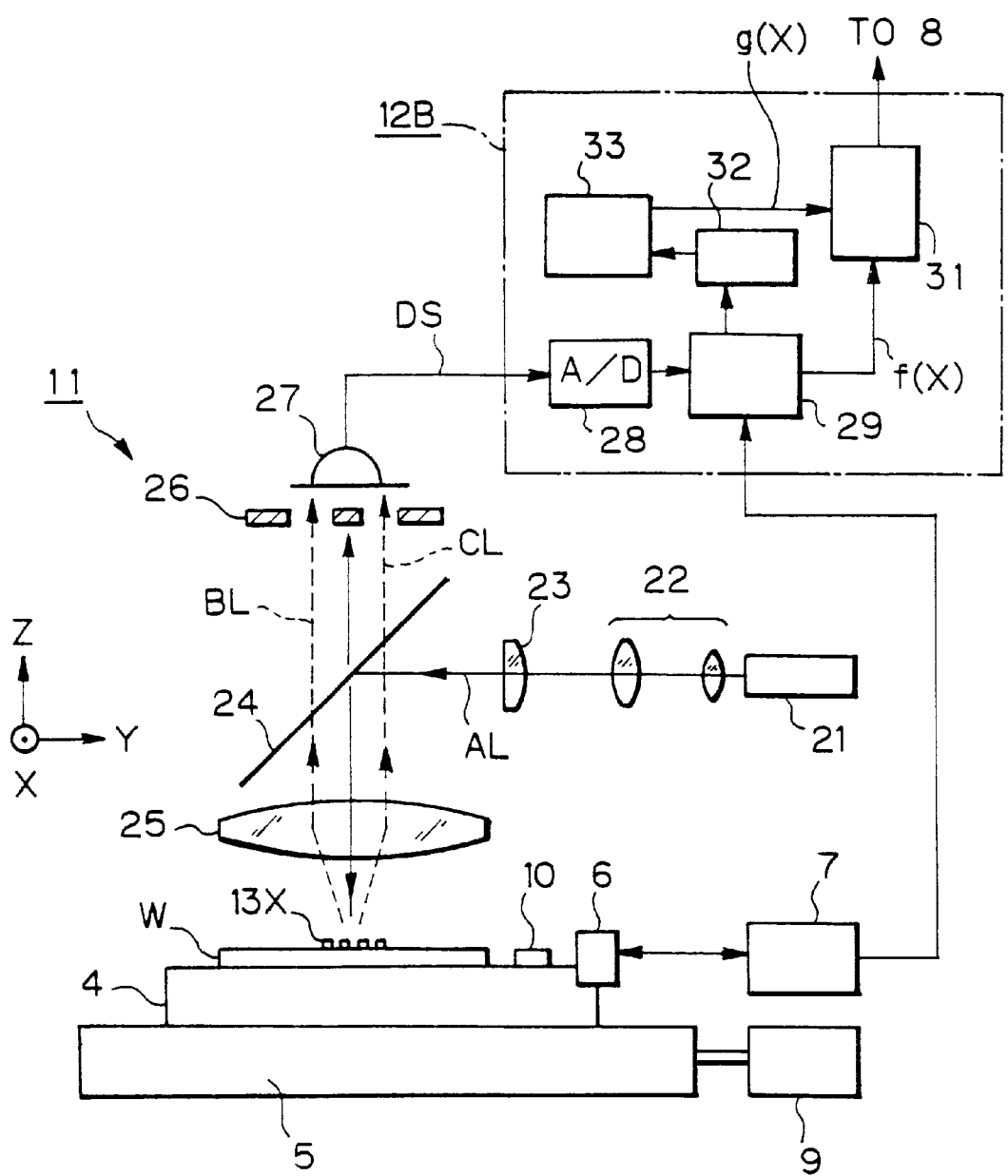
FIG. 8 is a diagram showing an alignment sensor as a position detecting apparatus according to a fourth embodiment of the present invention.

Next, a position detecting apparatus according to a fourth embodiment of the present invention will be explained with reference to FIGS. 8 to 11. In FIG. 8, the same elements as those shown in FIG. 1 are designated by the same reference numerals. As is in the embodiment shown in FIG. 1, also in this fourth embodiment, the present invention is applied to an alignment sensor of off-axis type and of laser beam scan type provided within a projection exposure apparatus. However, an alignment signal treatment system 12B differs from the alignment signal treatment system 12 of FIG. 1.

Regarding the alignment signal treatment system 12B according to this embodiment, in the memory portion 29, the digital data of the detection signal DS A/D-converted through the photoelectric detector 27 (i.e. mark detection signal f(X)) are stored in the memory in such a manner that the data correspond to the X-coordinate value of the specimen plate 4 measured by the laser interferometer 7, and the detection signal f(X) is supplied to the signal treatment portion 31.

In the memory portion 29, the mark detection signal which was previously detected with respect to a predetermined wafer mark is supplied to a reference signal forming portion 32. In the reference signal forming portion 32, the mark detection signal is made symmetrical in the measurement direction and the change in the mark detection signal is emphasized, thereby obtaining an emphasized reference signal g(X) which will be described later. The emphasized reference signal is stored in a reference signal memory portion 33. In the signal treatment portion 31, a correlation function between the mark detection signal f(X) supplied from the memory portion 29 and the emphasized reference signal g(X) read out from the reference signal memory portion 33 is calculated. Further, in the signal treatment portion 31, a position where the correlation function becomes maximum is determined as the position of the wafer mark to be detected, and the determined result is supplied to the main control system 8 of FIG. 14.

Next, an operation of the signal treatment portion 31 and the emphasized reference signal according to this embodiment will be explained. In this case, it is assumed that, as indicated by the bottom surface 13Xa in FIG. 2B, the bottom surface of the recessed portion of the wafer mark 13X to be detected is inclined by an angle e (as an error) in the measurement direction.

If the wafer mark is asymmetrical in the measurement direction in this way, the mark detection signal f(X) which is the digital data of the detection signal DS outputted from the photoelectric detector 27 of FIG. 8 will also become asymmetrical, thereby causing an error in the position detection value. An example of such an asymmetrical mark detection signal f(X) is shown in FIG. 9A.

Figure 9A:
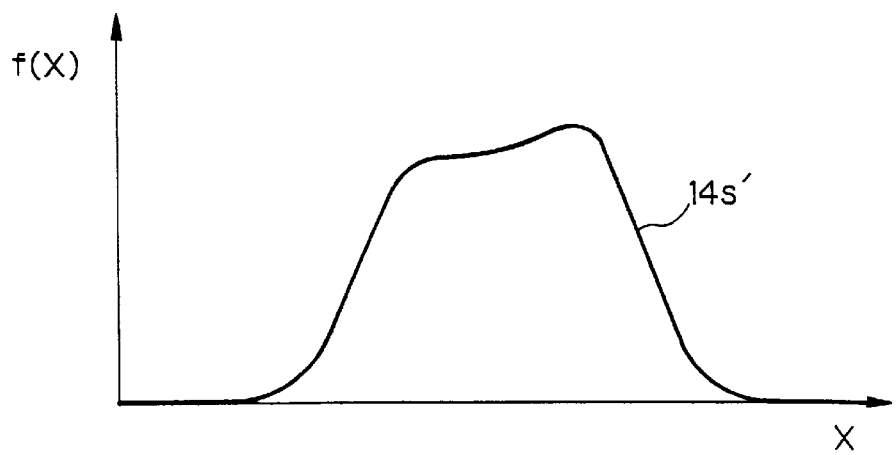
FIGS. 9A to 9C are graphs showing a mark detection signal f(X), an emphasized reference signal g(X), and a correlation function h(X) between these signals used in the fourth embodiment.
Figure 9B:
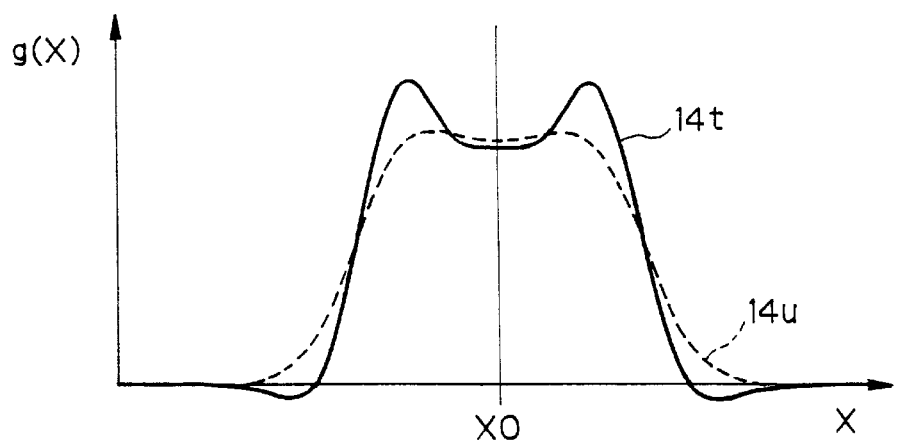

In FIG. 9A, the abscissa indicates an X-coordinate value of the specimen plate 4 (wafer W) and the ordinate indicates a value of the mark detection signal f(X) at respective X-coordinate value. As indicated by the solid line curve 14s' in FIG. 9A, the mark detection signal f(X) is asymmetrically changed in the measurement direction (X direction). On the other hand, the solid line curve 14t in FIG. 9B shows the emphasized reference signal g(X) stored in the reference signal memory portion 33. In FIG. 9B, the broken line curve 14u shows a function which is similar to the curve 14s' of the mark detection signal f(X) and which is symmetrical with respect to a central position X0. The emphasized reference signal g(X) (curve 14t) is a signal in which the change portions in the function shown by the broken line curve 14u are emphasized (edge emphasis).

According to the illustrated embodiment, in the signal treatment portion 31, a correlation function h(X) between the mark detection signal f(X) and the emphasized reference signal g(X) is calculated by integration on the basis of the following equation (8), and a position where such a correlation function becomes maximum is determined as the mark position.

$$h(X) = \int f(t) \cdot g(t + X0 - X) dt \tag{8}$$

Figure 9C:
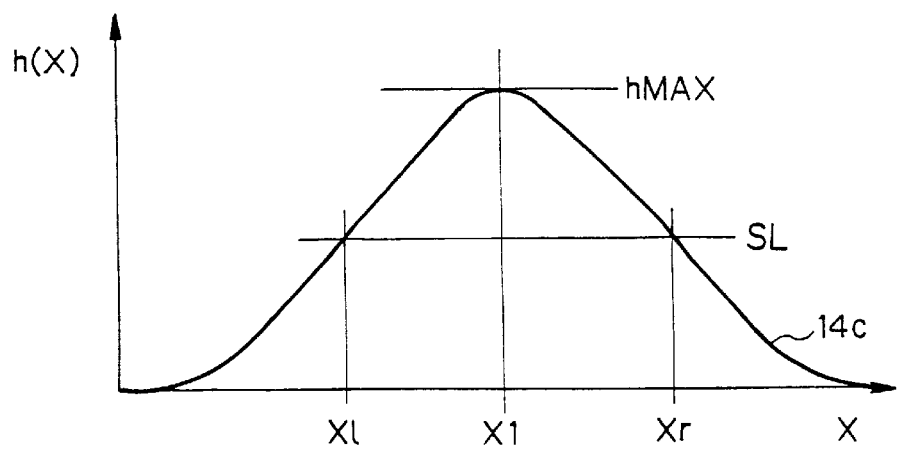

The solid line curve 14c in FIG. 9C shows the correlation function h(X) between the emphasized reference signal g(X) and the mark detection signal f(X) so calculated. In FIG. 9C, an X-coordinate value Xl corresponding to a maximum value hMAX of the correlation function h(X) is detected as the mark position in the signal treatment portion 31. Alternatively, the correlation function h(X) may be sliced at a predetermined slice level SL and a middle point between left and right slice positions (intersections) Xl, Xr may be determined as the position of the wafer mark.

Incidentally, the function represented by the broken line curve 14u in FIG. 9B corresponds to a reference signal having substantially the same waveform as that of a mark detection signal used in the conventional function detecting method, and the emphasized reference signal g(X) (curve 14t) corresponds to a signal in which the change portion in the conventional reference signal (curve 14u) is emphasized. When the correlation function is detected by using the conventional reference signal (curve 14u), if there is asymmetrical portion in the mark detection signal f(X) (such as the curve 14s' in FIG. 9A), the obtained correlation function is also asymmetrical, thereby causing the error in the mark detection value. To the contrary, according to the illustrated embodiment, since the emphasized reference signal g(X) in which the signal changing portions (edge portions) are further emphasized is used, without being influenced by the asymmetry (such as curve 14s') of the mark detection signal f(X), the relative function h(X) including more information regarding the edge positions can be obtained, thereby permitting the mark detection with higher accuracy.

Since the waveform of the curve 14s' of the mark detection signal f(X) is changed by layers on the wafer to be exposed, various waveforms may be previously stored in the reference signal memory portion 33 as emphasized reference signals g(X), and any waveform optimum to the present process may be selected and used by the operator. Alternatively, when the position of a first wafer among one lot of wafers during the present exposure process is detected, the mark detection signals f(X) regarding a plurality of wafer marks on the wafer may be detected and the emphasized reference signal g(X) may be obtained on the basis of an average value of the detected mark detection signals.

Next, a method for obtaining the emphasized reference signal will be explained with reference to FIGS. 10 and 11.

Figure 10A:
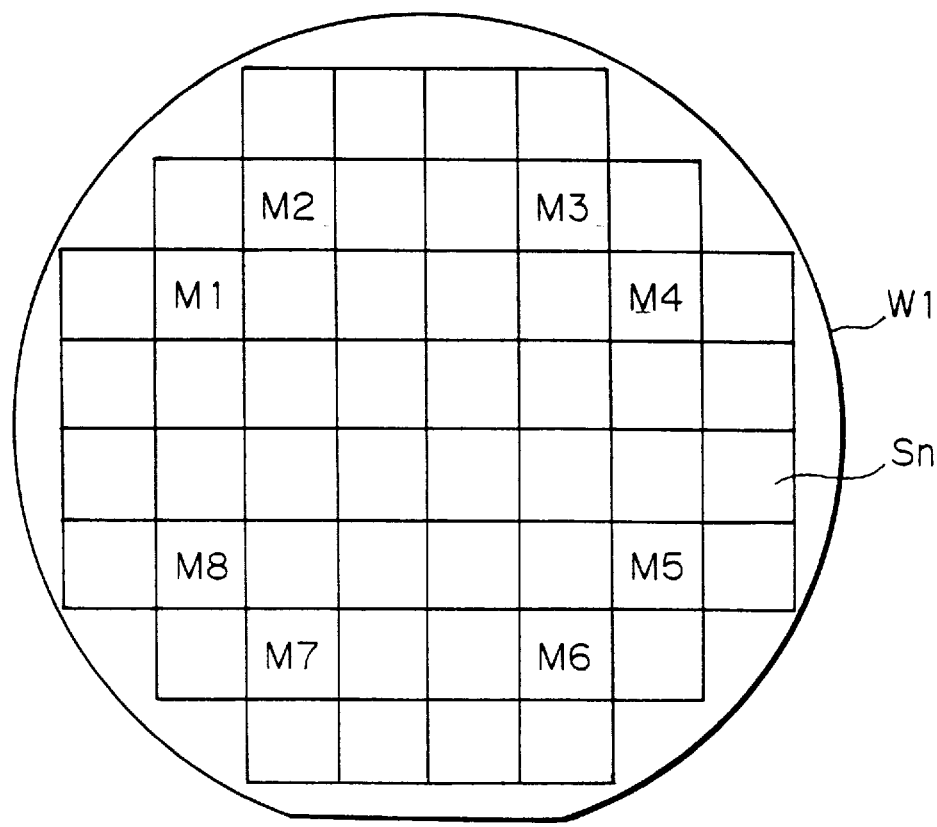
FIG. 10A is a view showing an example of an arrangement of a plurality of wafer marks on a wafer, and FIG. 10B are graphs showing an example of mark detection signals obtained from the wafer marks.

FIG. 10A shows the first wafer W1. In FIG. 10A, a number of shot areas Sn (n=1, 2, 3, . . . ) are disposed on the surface of the wafer W1 with predetermined column and row pitches. One or more wafer marks are formed in each shot area. In this case, among the wafer marks of the shot areas on the wafer W1, for example, eight particular wafer marks M1–M8 are selected. In this selection, it is desirable that the selected wafer marks become symmetrical with respect to a center of the wafer W1 so long as possible. Then, the mark detection signals fi(X) (i=1–8) of the eight wafer marks M1–M8 are sought by means of the alignment optical system 11 and the alignment signal treatment system 12B shown in FIG. 8, and the obtained mark detection signals are stored in the memory portion 29. In the memory portion 29, the mark detection signals fi(X) are successively supplied to the reference signal forming portion 32.

Figure 10B:
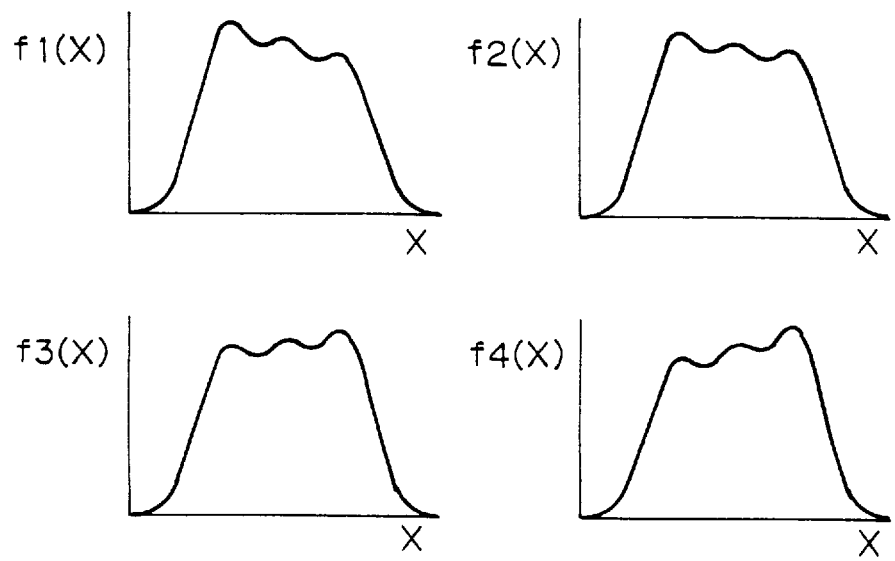

FIG. 10B shows four mark detection signals f1(X)–f4(X) among the eight mark detection signals fi(X). As shown in FIG. 10B, the mark detection signals f1(X)–f4(X) and the other mark detection signals (not shown) have different waveforms and are asymmetrical in themselves more or less. In the reference signal forming portion 32, by adding these mark detection signals f1(X)–f8(X) to each other, an addition signal s(X) (sum of eight mark detection signals f1(X)–f8(X)) is determined. However, the addition must be effected after the positions of the mark detection signals are aligned with each other to some extent in a detecting direction. To achieve this, in the reference signal forming portion 32, for example, self-function of each mark detection signal is calculated, and, after positions (referred to as "addition reference positions X0" hereinafter) where the self-functions become maximum are aligned with each other, the above-mentioned addition is effected. In place of the addition signal s(X), an average signal obtained by dividing the addition signal s(X) by a sample number (eight, in this case) may be used.

Since the addition signal s(X) is the sum of the mark detection signals of the wafer marks disposed symmetrically with respect to the center of the wafer W1, it is less asymmetrical. However, since it is desirable that the addition signal is not asymmetrical in order to use the addition signal as the reference signal g(X), a symmetrical addition signal p(X) (in which the addition signal s(X) is made symmetrical) can be obtained on the basis of the following equation (9) by adding to the addition signal s(X) a signal obtained by reversing said addition signal s(X) (reversing the X-coordinate) with respect to the addition reference position X0.

$$p(X) = f(X) + f(2 \times X0 - X) \quad (9)$$

Figure 11:
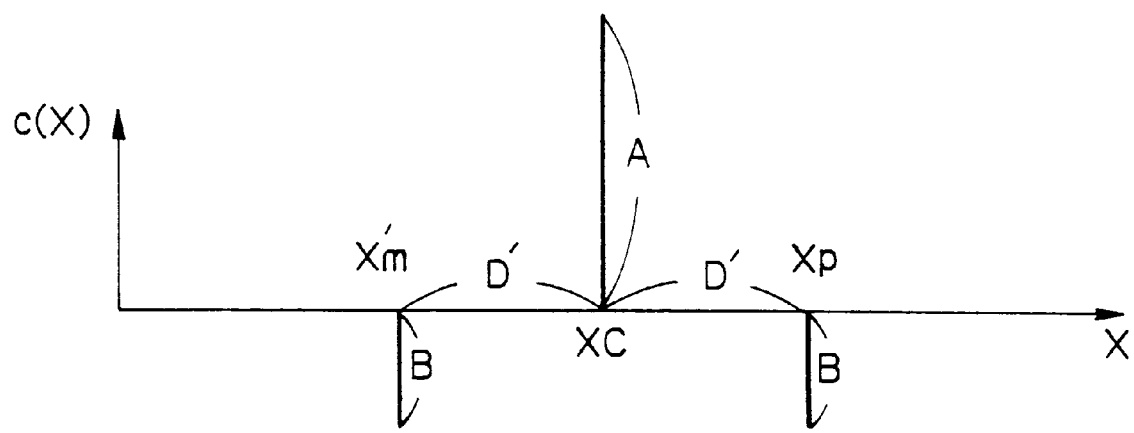
FIG. 11 is a graph showing a numerical number filter c(X) used in a signal emphasizing portion 32 of the fourth embodiment.

In this way, convolution calculation is effected between the symmetrical addition signal p(X) and a signal emphasizing numerical filter c(X) as shown in FIG. 11 to emphasize the edges, thereby obtaining the emphasized reference signal g(X). The convolution calculation is represented by integration calculation as indicated by the following equation (10):

$$g(X) = \int p(t) \cdot c(X-t) dt \quad (10)$$

In FIG. 11, the abscissa indicates an X-coordinate value and the ordinate indicates a value of the numerical filter c(X). A value of the numerical filter c(X) at a reference point XC on the abscissa (X-coordinate) is A (positive real number) and a value of the numerical filter at two points (coordinates X'p, X'm) spaced apart from the reference point XC by a distance D' in both forward and backward direction along the abscissa is B (negative real number). As an absolute value of B is increased with respect to an absolute value of A, the signal change (edges) in the emphasized reference signal g(X) is more emphasized accordingly. Thus, it is desirable that the values A, B can be set (inputted to the apparatus) by the operator. The distance D' is selected to about 0.3 μm, for example, but may have any other value. In the convolution calculation, in order to equalize the average value of the emphasized reference signal g(X) to the average value of the addition signal p(X), the condition of the above equation (1) (A+2B=1) may be satisfied. As a result, post-signal treatments may be facilitated.

The signal emphasizing treatment in the reference signal forming portion 32 according to the illustrated embodiment is not limited to the convolution calculation of the above-mentioned numerical filter. For example, the symmetrical addition signal p(X) may be Fourier-converted and a component of the converted result having a value greater than a predetermined spacial frequency may be increased by predetermined times, and then the increased component may be reverse-Fourier-converted.

Also in the alignment sensor according to this embodiment, as is in the first embodiment, prior to the position detection, a positional relation between the illumination position of the laser beam AL to be used for detection and the optical axis AX (exposure center) of the projection optical system 3 of FIG. 14 must be measured (i.e., base line check must be performed). In this case, when the reference marks of the reference plate 10 are detected, since the detection signal is symmetrical, any waveform of the reference signal g(X) may be used so long as the reference signal is symmetrical.

Figure 12:
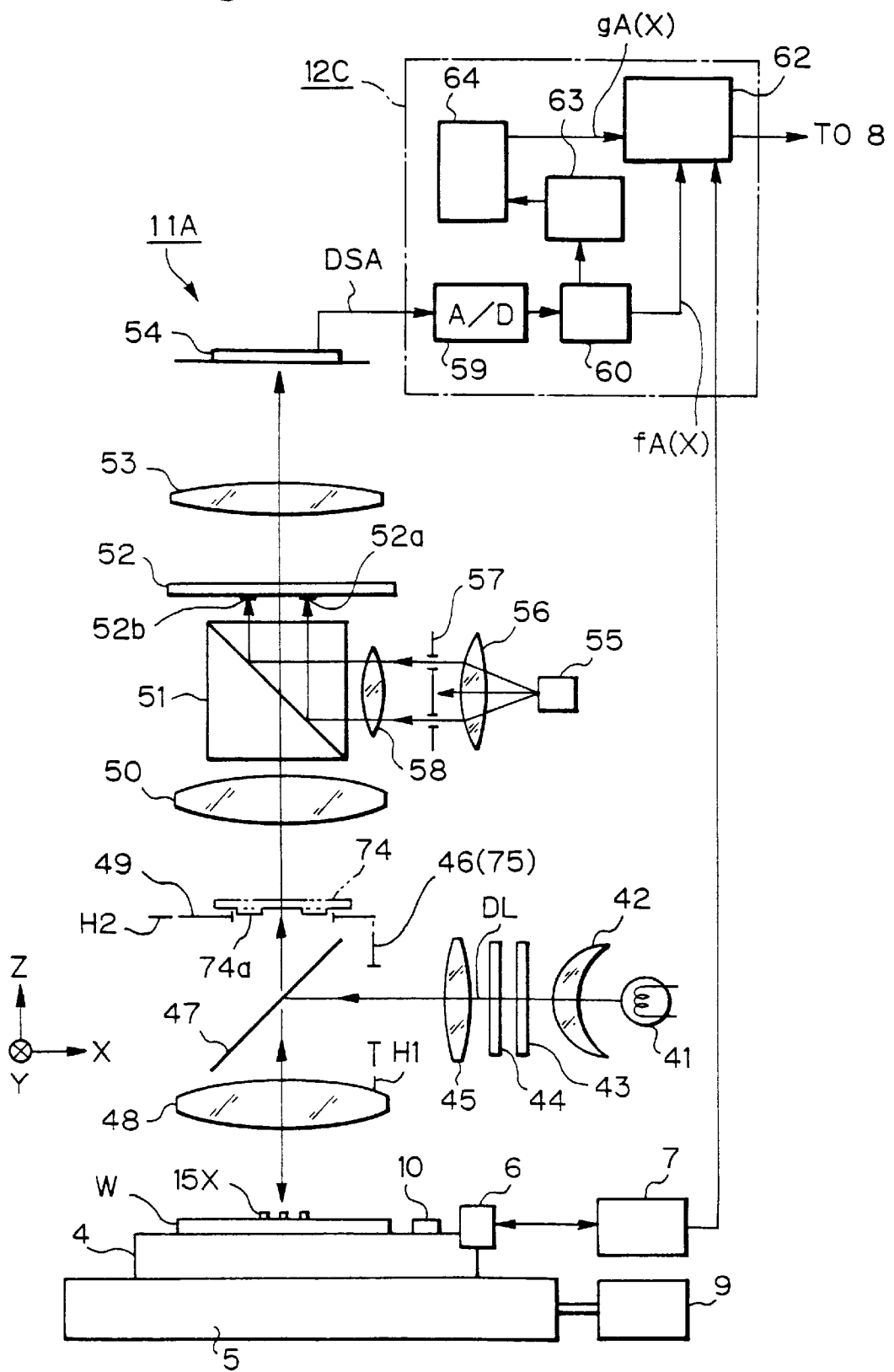
FIG. 12 is a diagram showing an alignment sensor according to a fifth embodiment of the present invention.

Next, a fifth embodiment of the present invention will be explained with reference to FIGS. 12 and 13. In FIG. 12, the same elements as those shown in FIG. 4 are designated by the same reference numerals. As is in the embodiment shown in FIG. 4, in this fifth embodiment, the present invention is applied to an alignment sensor of off-axis type and of image forming position detecting type provided within a projection exposure apparatus. In this embodiment, an alignment signal treatment system 12C differs from the alignment signal treatment system 12A shown in FIG. 4.

Also in the alignment signal treatment system 12C according to the illustrated embodiment, in a memory portion 60, the digital data of the imaging signal DSA, i.e. mark detection signal fA(X) are successively stored in a memory. The mark detection signal fA(X) read out from the memory portion 60 is supplied to a signal treatment portion 62, and, at the same time, is supplied to a reference signal forming portion 63 in the illustrated embodiment. In the reference signal forming portion 63, an emphasized reference signal gA(X) in which the change portion in the mark detection signal f(X) is emphasized is generated, and this emphasized reference signal is stored in a reference signal memory portion 64. Then, in the signal treatment portion 62, a relative function between the mark detection signal fA(X) read out from the memory portion 60 and the emphasized reference signal gA(X) read out from the reference signal memory portion 64 is sought, and, on the basis of the relation function, a relative positional deviation amount ΔX of the wafer mark 15X relative to the index marks 52a, 52b in the X direction is determined. The X-coordinate value of the specimen plate 4 measured by the laser interferometer 7 is also supplied to the signal treatment portion 62. In the signal treatment portion 62, a value obtained by adding the positional deviation amount ΔX to the X-coordinate values from the laser interferometer 7 is sought as an X-coordinate value of the wafer mark 15X, and this X-coordinate value is supplied to the main control system 8 of FIG. 14.

Next, an operation of the signal treatment portion 62 and the reference signal according to the illustrated embodiment will be explained.

Since a wafer mark according to the illustrated embodiment has the same construction as that of the wafer mark 15X shown in FIG. 5, such a wafer mark is designated by 15X. Regarding the recessed portions 16A–16C of the wafer mark 15X, images formed on the imaging element 54 have very low contrast, as indicated by the solid line curve 17u1 in FIG. 13A.

Figure 13A:
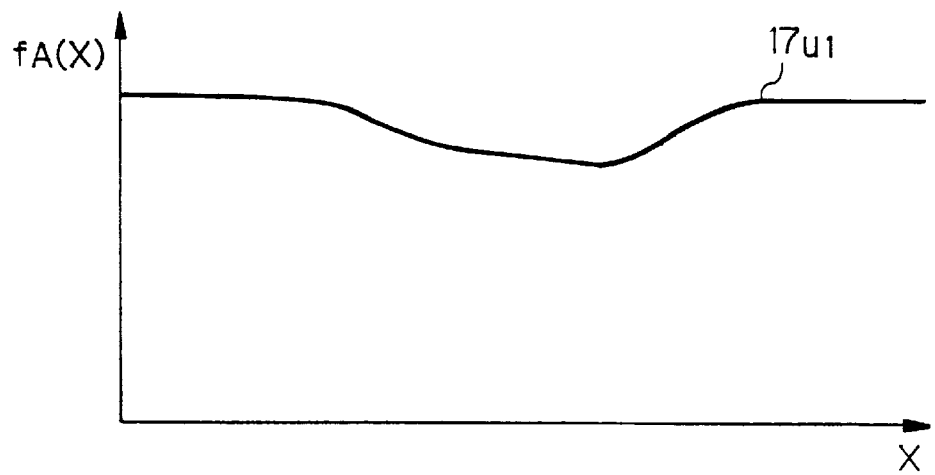
FIGS. 13A to 13C are graphs showing a mark detection signal fA(X), an emphasized reference signal gA(X), and a relative function hA(X) between these signals, used in the fifth embodiment.

That is to say, FIG. 13A shows the mark detection signal fA(X) read out from the memory portion 60 in FIG. 12 by one mark period (one pitch). In FIG. 13A, the abscissa indicates an X-coordinate value on the wafer W (an origin may be at any position) and the ordinate indicates a value of the mark detection signal fA(X). The mark detection signal fA(X) (curve 17u1) becomes small slightly at a position corresponding to the recessed portion of the wafer mark, and the mark image becomes asymmetrical in correspondence to the asymmetry of the wafer mark 15X itself. The reason why the mark detection signal fA(X) becomes low contrast as shown in FIG. 13A is that the wafer mark 15X has a very small amount of level difference. In this way, regarding the image (mark detection signal fA(X)) having low contrast and small amount of level difference, as is in the conventional techniques, when a correlation method for determining the correlation function between the mark detection signal and the reference signal having substantially the same waveform as the detection signal is used, it is difficult to detect the mark position with high accuracy.

To avoid this, in the signal treatment portion 62 according to the illustrated embodiment, the emphasized reference signal gA(X) which is stored in the reference signal memory portion 64 and in which the change portion in signal (edges) is emphasized is used as the reference signal.

Figure 13B:
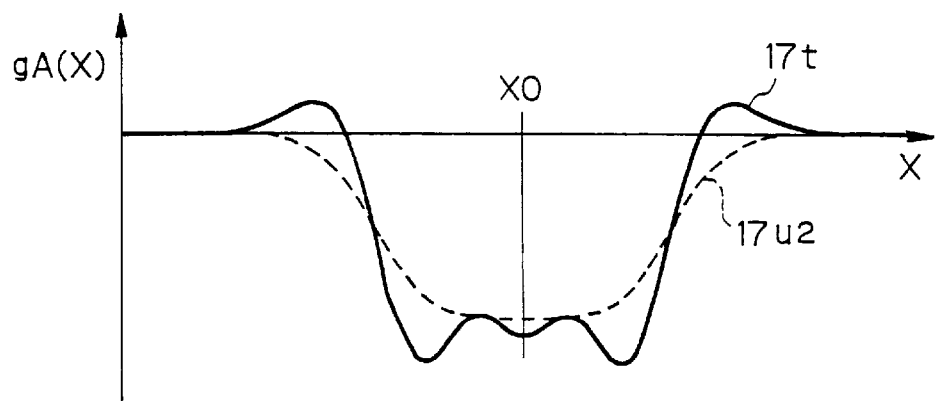

The solid line curve 17t in FIG. 13B shows the emphasized reference signal gA(X). In FIG. 13B, the broken line curve 17u2 shows a signal which has a minus value at a position corresponding to the recessed portion of the wafer mark and has a zero value at the other positions. This signal resembles to the mark detection signal fA(X) (curve 17u1) in which the signal intensity is decreased at the position corresponding to the recessed portion of the wafer mark. The emphasized reference signal gA(X) is a signal in which the change (edges) portion of the broken line curve 17u2 are emphasized. In the signal treatment portion 62, a correlation function hA(X) between the mark detection signal fA(X) and the emphasized reference signal gA(X) is sought.

Figure 13C:
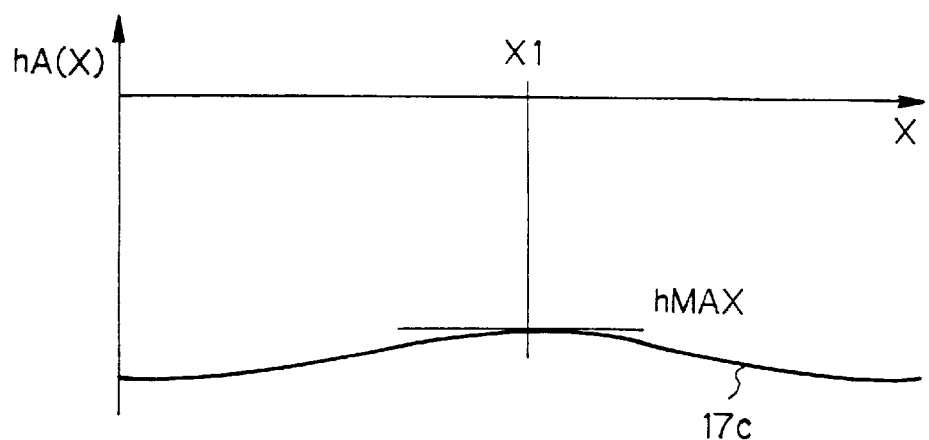

The solid line curve 17c in FIG. 13C shows the correlation function hA(X) so determined. As shown in FIG. 13C, the correlation function hA(X) has a minus value entirely. In the signal treatment portion 62, a position X1 corresponding to a maximum value hMAX of the correlation function is regarded as one of the mark positions of the wafer mark 15X. Actually, since the wafer mark 15X includes a plurality of marks and the mark detection signal fA(X) includes sections corresponding to the plural marks, the correlation function hA(X) has a plurality of maximum values. In the signal treatment portion 62, positions corresponding to the maximum values are judged as plural mark positions and an average value is regarded as the detection position of the wafer mark 15X.

On the other hand, as is clear from FIG. 5A, since image intensity distribution of imaginary index mark images 52aW, 52bW appears on both ends of the mark detection signal fA(X), in the signal treatment portion 62, an average value of left and right end maximum values of the correlation function hA(X) corresponding to the both ends of the mark detection signal is regarded as the detection position of the index marks 52a, 52b. Since the index marks 52a, 52b are not no asymmetrical and, thus, the detection signals corresponding to the index marks 52a, 52b are symmetrical, the reference signal for determining the relative function to the index marks 52a, 52b may differ from the emphasized reference signal for detecting the wafer mark 15X. That is to say, as the reference signal for detecting the index marks 52a, 52b, a normal reference signal in which the edge is not emphasized. (as indicated by the broken line curve 17u2 in FIG. 13B) may be used.

In the signal treatment portion 62 according to the illustrated embodiment, a deviation amount (difference) ΔX of the detection position of the wafer mark 15X with respect to the detection position of the index marks 52a, 52b is determined, and a value obtained by adding the deviation amount ΔX to the X-coordinate value detected by the laser interferometer 7 is determined as the X-coordinate value of the wafer mark 15X, and this X-coordinate value is supplied to the main control system 8 of FIG. 14.

In this case, as is in the fourth embodiment, also in the fifth embodiment, since the waveform of the mark detection signal fA(X) is changed in accordance with layers on the wafer, various emphasized reference signals gA(X) having different waveforms are stored in the emphasized reference signal memory portion 64 so that the optimum emphasized reference signal can be selected by the operator.

Alternatively, as is in the first embodiment, in the reference signal forming portion 63 of FIG. 12, mark detection signals fA(X) of a predetermined number of wafer marks on a first wafer among one lot of wafers may be added to each other to effect the symmetrizing in the measurement direction and the signal emphasizing, thereby calculating the emphasized reference signal gA(X). Incidentally, in the illustrated embodiment, unlike the mark detection signal f(X) in the fourth embodiment, the value of the mark detection signal fA(X) does not become zero even at positions other than the mark portions of the wafer mark. Thus, when the emphasized reference signal gA(X) is calculated, in the reference signal forming portion 63, after the treatment similar to the fourth embodiment was performed, the signal values at the positions other than the mark positions must be zero by subtracting the values of the positions other than the mark positions from the entire signal.

Also in the fifth embodiment shown in FIG. 12, as is in the second embodiment shown in FIG. 4, a phase contrast plate 74 may be disposed on the imaging pupil plane H2 in the vicinity of the imaging aperture stop 49 to provide a phase contrast microscope. The phase contrast plate 74 may be the same as that shown in FIG. 7. Also in this case, when the phase contrast microscope is used as the alignment optical system (detection optical system), regarding the wafer mark having a very small amount of level difference, high contrast detection image can be obtained.

In the above-mentioned embodiment, while an example that the present invention is applied to the alignment sensor of off-axis type was explained, the present invention can similarly be applied to an alignment sensor of TTL (through-the-lens) type in which a position of a wafer mark is detected through a projection optical system or an alignment sensor of TTR (through-the-reticle) type in which a positional deviation between a position detection mark (reticle mark) on a reticle and a wafer mark through the reticle and a projection optical system. Further, the present invention can be applied to various measuring apparatuses, as well as the alignment sensors for the projection exposure apparatus.

In this way, the present invention is not limited to the aforementioned embodiments, various alterations and modifications can be effected without departing from the scope of the invention.

EFFECTS OF THE INVENTION

According to the position detecting apparatus of the first embodiment of the present invention, since the position detection is performed by using the emphasized signal in which the change portion in the detection signal outputted from the detection optical system is emphasized, even regarding the position detection mark having a very small amount of level difference and producing very low contrast mark detection signal, the position of the mark can be detected correctly. Further, even regarding the position detection mark having small amount of level difference and being asymmetrical in the measurement direction, the position of the mark can be detected correctly.

In this case, when the signal treatment means determines the slice level on the basis of the signal in which the change portion is emphasized by the signal emphasizing means and the position of the position detection mark is detected by slicing the detection signal outputted from the detection optical system at the slice level so determined, the position of the position detection mark can be detected correctly with simple treatment.

On the other hand, when the signal treatment means determines the slice level on the basis of the signal in which the change is emphasized by the signal emphasizing means and the position of the position detection mark is detected by slicing the signal (emphasized signal) in which the change portion is emphasized by the signal emphasizing means at the slice level so determined, since the level adjustment is not needed even when the average level of the emphasized signal differs from the average level of the detection signal, the signal treatment can be simplified.

When the signal emphasizing means multiplies the signal corresponding to the predetermined first position of the detection signal outputted from the detection optical system by A times (A is a positive real number) and multiplies the signals corresponding to the second and third positions of the detection signal spaced apart from the first position in both forward and backward directions along the measurement direction of the detection mark by B times (B is a negative real number) and the addition of the signal multiplied by A times and the two signals multiplied by B times is effected, the signal can be emphasized with relatively simple calculation.

When the signal emphasizing means emphasizes the intensity of the signal having the frequency component greater than the predetermined frequency component of the detection signal outputted from the detection optical system, since the spatial frequency of the component to be emphasized can be specified, it is effective particularly when the position detection mark has a predetermined periodical feature.

When the detection optical system emits the illumination light in such a manner that the illumination light is collected in the vicinity of the position detection mark on the substrate and the light returned from the position detection mark during the relative scan between the position detection mark and the illumination light is detected, the present invention can be applied to an alignment sensor of laser beam scan type.

According to the second embodiment of the present invention, when the detection optical system includes the imaging optical system 54 for forming the image of the position detection mark on the substrate and the imaging signal of the image of the position detection mark is outputted as the detection signal, the present invention can be applied to an alignment sensor of image forming position detecting type.

According to the third embodiment of the present invention, in the case where the phase contrast filter 74 is disposed within the imaging optical system in the vicinity of the Fourier transform plane for the position detection mark and the detection optical system of the present invention is used as an optical system of phase contrast microscope type, when the image of the position detection mark having a very small amount of level difference is obtained with high contrast, since the influence of the asymmetrical condition of the image can be reduced, the present invention becomes particularly effective.

According to the fourth embodiment of the present invention, since the position of the position detection mark is detected by determining the relative function h(X) or hA(X) between the detection signal outputted from the detection optical system and the reference signal in which the signal change (edges) is emphasized, in the consideration of the fact that the relative function includes more information regarding the edge portions of the position detection mark, even regarding the position detection mark having minute unevenness (very small amount of level difference), i.e., the position detection mark providing very low contrast detection signal, the position of the mark can be detected with high accuracy. Further, even regarding the position detection mark having minute unevenness (very small amount of level difference) and being asymmetrical in the measurement direction, the position of the mark can be detected with high accuracy.

Further, when the average signal of the detection signals of the plurality of position detection marks successively obtained through the detection optical system is determined, and there is provided the signal emphasizing means for emphasizing the change portion in the average signal, and the signal in which the change portion is emphasized by the signal emphasizing means is used as the reference signal, by using the emphasized reference signal obtained on the basis of the actual position detection mark, the position detection can be performed with high accuracy. In addition, the emphasized reference signal can easily be formed.

When the signal emphasizing means emphasizes the change in the average signal and the signal in which the change portion is emphasized is made symmetrical in the measurement direction, even regarding the position detection mark being asymmetrical in the measurement direction, the symmetrical emphasized reference signal can be obtained. Accordingly, even when the position detection mark to be detected is asymmetrical in the measurement direction, the position of the mark can be detected with high accuracy.

Lastly, when the signal emphasizing means multiplies the signal corresponding to the predetermined first position of the detection signal outputted from the detection optical system by A times (A is a positive real number) and multiplies the signals corresponding to the second and third positions of the detection signal spaced apart from the first position in both forward and backward directions along the measurement direction of the detection mark by B times (B is a negative real number) and the addition of the signal multiplied by A times and the two signals multiplied by B times is effected to emphasize the change in the average signal, the signal can be emphasized with relatively simple calculation.

What is claimed is:

1. A substrate position detecting method, comprising the steps of:

illuminating illumination light onto a position detection mark on a substrate and receiving light returned from said position detection mark, and outputting a detection signal;

obtaining an emphasized reference signal by emphasizing at least one change portion in the detection signal; and detecting the position of said position detection mark by using a slice level on the basis of said emphasized reference signal.

2. A substrate position detecting method according to claim 1, wherein said step of detecting the position of said position detection mark includes the step of:

determining a slice level on the basis of the emphasized reference signal and slicing said detection signal at the determined slice level, thereby detecting the position of said position detection mark.

3. A substrate position detecting method according to claim 1, wherein said step of detecting the position of said position detection mark includes the step of:

determining a slice level on the basis of the emphasized reference signal and slicing said emphasized reference signal at the determined slice level, thereby detecting the position of said position detection mark.

4. A substrate position detecting method, comprising the steps of:

illuminating illumination light onto a position detection mark on a substrate, receiving the light returned from said position detection mark, and outputting a detection signal;

obtaining and storing a predetermined emphasized reference signal in which at least one change portion is emphasized more than the detection signal;

calculating a correlation function obtained from a correlation between the detection signal and the emphasized reference signal while laterally shifting both the detection signal and the emphasized reference signal relative to each other, and seeking an amount of relative lateral shift between these two signals when the correlation function becomes a predetermined value; and detecting the position of said position detection mark on the basis of the amount of relative lateral shift.

5. A substrate position detecting method according to claim 4, where said step of obtaining and storing the emphasized reference signal includes the step of:

seeking an average signal of the detection signals of a plurality of position detection marks successively obtained, and emphasizing the change portion in said average signal, thereby obtaining the emphasized reference signal.

6. A substrate position detecting method according to claim 5, wherein said step of obtaining and storing the emphasized reference signal includes the steps of:

emphasizing the change portion in said average signal; and making the signal in which the change portion is emphasized asymmetrical in a measurement direction.

7. A substrate position detecting apparatus, comprising:

a detection optical system, optically connected to said substrate, to receive a light from a position detection mark and to output a detection signal;

a signal treatment system, connected to said detection optical system, to detect a position of said position detection mark; and a signal emphasizing system, connected to said signal treatment system, to emphasize at least one change portion in the detection signal outputted from said detection optical system, wherein said signal treatment system determines a slice level on the basis of the signal in which the change portion is emphasized by said signal emphasizing system and detects the position of said position detection mark on the basis of the determined slice level.

8. A substrate position detecting apparatus according to claim 7, wherein said signal emphasizing system performs a treatment in which a signal corresponding to a predetermined first position of the detection signal among the detection signals outputted from said detection optical system is multiplied by A (A is a positive real number), signals among the detection signals corresponding to second and third positions of the detection signal spaced apart from said first position by predetermined distances in both forward and backward opposite directions along a measurement direction are multiplied by B (B is a negative real number), and the signal multiplied by A is added to the two signals multiplied by B.

9. A substrate position detecting apparatus according to claim 7, wherein said signal emphasizing system performs a treatment in which intensity of a signal corresponding to a component greater than a predetermined frequency component of the detection signal outputted from said detection optical system is emphasized.

10. A substrate position detecting apparatus according to claim 7, wherein said detection optical system illuminates the illumination light on said substrate in such a manner that the illumination light is collected in the vicinity of said position detection mark and detects the light returned from said position detection mark when said position detection mark and the illumination light are scanned relative to each other.

11. A substrate position detecting apparatus according to claim 7, wherein said detection optical system includes an image forming optical system for forming an image of said position detection mark on said substrate and outputs an imaging signal corresponding to the image of said position detection mark as the detection signal.

12. A substrate position detecting apparatus according to claim 11, wherein a phase contrast filter is disposed in the vicinity of a Fourier transform plane regarding said position detection mark so that said detection optical system corresponds to an optical system of phase contrast microscope type.

13. A substrate position detecting apparatus according to claim 7, wherein said detection optical system illuminates illumination light onto a position detection mark on said substrate and receives light returned from said position detection mark.

14. A substrate position detecting apparatus according to claim 7, wherein said signal treatment system slices the detection signal outputted from said detection optical system at the determined slice level, thereby detecting the position of said position detection mark.

15. A substrate position detecting apparatus according to claim 7, wherein said signal treatment system slices the signal in which the change portion is emphasized by said signal emphasizing system at the determined slice level, thereby detecting the position of said position detection mark.

16. A substrate position detecting apparatus, comprising:
a detection optical system, optically connected to said substrate, to receive a light from a position detection mark and to output a detection signal, whereby a position of said position detection mark is detected on the basis of the detection signal outputted from said detection optical system;
a memory system that stores a predetermined emphasized reference signal in which at least one change portion is emphasized more than the detection signal; and
a signal treatment system, connected to said detection optical system, to calculate a correlation function obtained from a correlation between the detection signal and the emphasized reference signal read out from said memory system while laterally shifting the detection signal and the emphasized reference signal relative to each other and for seeking an amount of relative lateral shift between these two signals when the correlation function becomes a predetermined value,
wherein the position of said position detection mark is determined on the basis of the amount of relative lateral shift sought by said signal treatment system.

17. A substrate position detecting apparatus according to claim 16, further comprising a signal emphasizing system for seeking an average signal of the detection signals of a plurality of said position detection marks successively obtained through said detection optical system and for emphasizing the change portion in said average signal, and wherein the signal in which the change portion is emphasized by said signal emphasizing system is used as the emphasized reference signal.

18. A substrate position detecting apparatus according to claim 17, wherein said signal emphasizing system emphasizes the change portion in the average signal and makes the signal in which the change portion is emphasized symmetrical in a measurement direction.

19. A substrate position detecting apparatus according to claim 17, wherein said signal emphasizing system performs a treatment in which a signal corresponding to a predetermined first position of the average signal is multiplied by A (A is a positive real number), signals corresponding to second and third positions of the average signal spaced apart from the first position by predetermined distances in both forward and backward directions along a measurement direction are multiplied by B (B is a negative real number), and the signal multiplied by A is added to the signals multiplied by B, thereby emphasizing the change portion in the average signal.

20. An exposure method of exposing a substrate with an illuminated pattern, comprising:
illuminating illumination light onto a position detection mark on the substrate and of receiving light returned from said position detection mark, and outputting a detection signal;
obtaining an emphasized reference signal by emphasizing at least one change portion in the detection signal;
detecting the position of said position detection mark by using a slice level on the basis of said emphasized reference signal, and
aligning said substrate with the illuminated pattern on the basis of said detected position.

21. An exposure method according to claim 20, wherein said step of detecting the position of said position detection mark includes the steps of:
determining a slice level on the basis of the emphasized reference signal; and
slicing said detection signal at the determined slice level, thereby detecting the position of said position detection mark.

22. An exposure method according to claim 20, wherein detecting the position of said position detection mark includes the steps of:
determining a slice level on the basis of the emphasized reference signal; and
slicing said emphasized reference signal at the determined slice level, thereby detecting the position of said position detection mark.

23. An exposure method of exposing a substrate with an illuminated pattern, comprising:
illuminating illumination light onto a position detection mark on the substrate, receiving the light returned from said position detection mark, and outputting a detection signal;
obtaining and storing a predetermined emphasized reference signal in which at least one change portion is emphasized more than the detection signal;
calculating a correlation function obtained from a correlation between the detection signal and the emphasized reference signal while laterally shifting both the detection signal and the emphasized reference signal relative to each other, and seeking an amount of relative lateral shift between these two signals when the correlation function becomes a predetermined value;
detecting the position of said position detection mark on the basis of the amount of relative lateral shift; and
aligning said substrate with the illuminated pattern on the basis of said detected position.

24. An exposure method according to claim 23, wherein the step of obtaining and storing the emphasized reference signal includes the step of:
seeking an average signal of the detection signals of a plurality of said position detection marks successively obtained; and
emphasizing the change portion in said average signal, thereby obtaining the emphasized reference signal.

25. An exposure method according to claim 23, wherein the step of obtaining and storing the emphasized reference signal includes the steps of:
emphasizing the change portion in said average signal; and
making the signal in which the change portion is emphasized asymmetrical in a measurement direction.

* * * * *

UNITED STATES PATENT AND TRADEMARK OFFICE
CERTIFICATE OF CORRECTION

PATENT NO.: 6,108,089
DATED : August 22, 2000
INVENTOR(S): Naomasa SHIRAISHI

It is certified that error appears in the above-identified patent and that said Letters Patent is hereby corrected as shown below:

ON THE COVER PAGE:

Item [30], change, "Oct. 11, 1995" to --Nov. 10, 1995--.

Signed and Sealed this

Twenty-fourth Day of April, 2001

Attest:

NICHOLAS P. GODICI

Attesting Officer

Acting Director of the United States Patent and Trademark Office